United States Patent
Oshita

(10) Patent No.: US 10,181,829 B2
(45) Date of Patent: Jan. 15, 2019

(54) AMPLIFICATION CIRCUIT

(71) Applicant: Murata Manufacturing Co., Ltd., Nagaokakyo-shi, Kyoto-fu (JP)

(72) Inventor: Teruaki Oshita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/631,035

(22) Filed: Jun. 23, 2017

(65) Prior Publication Data

US 2017/0302236 A1 Oct. 19, 2017

Related U.S. Application Data

(63) Continuation-in-part of application No. 15/192,073, filed on Jun. 24, 2016, now Pat. No. 9,722,548.

(30) Foreign Application Priority Data

Jul. 2, 2015 (JP) .................................. 2015-133914
Apr. 11, 2016 (JP) .................................. 2016-079139

(51) Int. Cl.
*H03F 3/45* (2006.01)
*H03F 3/217* (2006.01)
(Continued)

(52) U.S. Cl.
CPC ........... *H03F 3/2178* (2013.01); *H03F 1/303* (2013.01); *H03F 1/56* (2013.01); *H03F 3/005* (2013.01);
(Continued)

(58) Field of Classification Search
CPC .......... H03F 1/26; H03F 1/3211; H03F 3/211; H03F 1/0288; H03F 1/07; H03F 3/60;
(Continued)

(56) References Cited

U.S. PATENT DOCUMENTS 5,661,434 A * 8/1997 Brozovich ............ H03F 1/0277
330/310
7,420,412 B2 * 9/2008 Kim ...................... H03F 1/0211
330/124 D
(Continued)

FOREIGN PATENT DOCUMENTS

JP 2007-336544 A 12/2007
JP 2009-010826 A 1/2009
(Continued)

OTHER PUBLICATIONS

Oshita, "Amplification Circuit", U.S. Appl. No. 15/192,073, filed Jun. 24, 2016.
(Continued)

*Primary Examiner* — Khanh V Nguyen
(74) *Attorney, Agent, or Firm* — Keating Bennett, LLP

(57) ABSTRACT

An amplification circuit includes a first switching circuit that includes input terminals and first and second output terminals and that puts the second output terminal into an open state with respect to the input terminals while selectively putting the first output terminal into a state of being connected to any of the input terminals or selectively puts the second output terminal into a state of being connected to any of input terminals while putting the first output terminal into a state of being open with respect to the input terminals; a matching network that is connected to the first output terminal; an amplifier that is connected to an output side of the matching network; a second switching circuit that is connected to an output side of the amplifier; and a bypass path that electrically connects the second output terminal and an output terminal of the second switching circuit. The amplifier is a variable-gain amplifier.

16 Claims, 20 Drawing Sheets

(51) Int. Cl.
*H03F 3/00* (2006.01)
*H03F 3/04* (2006.01)
*H03F 1/30* (2006.01)
*H03F 1/56* (2006.01)
*H03F 3/195* (2006.01)
*H03F 3/72* (2006.01)
*H03F 3/191* (2006.01)
*H03F 1/02* (2006.01)
*H03F 3/21* (2006.01)

(52) U.S. Cl.
CPC ............... *H03F 3/04* (2013.01); *H03F 3/195* (2013.01); *H03F 3/72* (2013.01); *H03F 1/0277* (2013.01); *H03F 1/0288* (2013.01); *H03F 1/565* (2013.01); *H03F 3/191* (2013.01); *H03F 3/211* (2013.01); *H03F 2200/111* (2013.01); *H03F 2200/222* (2013.01); *H03F 2200/294* (2013.01); *H03F 2203/7209* (2013.01); *H03F 2203/7233* (2013.01); *H03F 2203/7236* (2013.01); *H03F 2203/7239* (2013.01)

(58) Field of Classification Search
CPC .......... H03F 3/602; H03F 3/605; H03F 3/607; H03G 1/0023; H03G 1/0035; H03G 1/0088; H03G 3/24; H03G 3/301

USPC ............... 330/51, 254, 286, 124 R, 295, 302
See application file for complete search history.

(56) References Cited

U.S. PATENT DOCUMENTS

| | | | |
|---|---|---|---|
| 8,461,921 B2 * | 6/2013 | Pletcher | ............... H03F 1/0277 330/302 |
| 2008/0012783 A1 | 1/2008 | Robert et al. | |
| 2011/0250926 A1 | 10/2011 | Wietfeldt et al. | |
| 2012/0235735 A1 | 9/2012 | Spits et al. | |

FOREIGN PATENT DOCUMENTS

| | | |
|---|---|---|
| JP | 2011-151771 A | 8/2011 |
| JP | 2013-512634 A | 4/2013 |
| JP | 2013-516110 A | 5/2013 |

OTHER PUBLICATIONS

Official Communication issued in Japanese Patent Application No. 2016-079139, dated Aug. 21, 2018.

* cited by examiner

AMPLIFICATION CIRCUIT

CROSS REFERENCE TO RELATED APPLICATIONS

This application claims the benefit of priority to Japanese Patent Application 2016-079139 filed Apr. 11, 2016 and Japanese Patent Application 2015-133914 filed Jul. 2, 2015. The entire contents of each application are hereby incorporated by reference.

BACKGROUND OF THE INVENTION

1. Field of the Invention

The present invention relates to an amplification circuit and in particular relates to an amplification circuit that selectively inputs an input signal to an amplifier and selectively bypasses an amplifier.

2. Description of the Related Art

There are amplification circuits, which are for an input signal received from an antenna or the like, in which processing is performed to cause an input signal to be input to and amplified by a low-noise amplifier in the case in which the input signal is a low-power signal and to cause the input signal to bypass the low-noise amplifier in the case in which the input signal is a high-power signal.

To date, a variety of amplification circuits equipped with a bypass circuit have been proposed that selectively perform low-noise amplification and bypassing in this manner (see, for example, Japanese Unexamined Patent Application Publication No. 2014-27501).

Japanese Unexamined Patent Application Publication No. 2014-27501 discloses a variable gain amplification circuit that includes a low-noise amplifier (hereafter, "amplifier") that is connected between an input matching network and an output matching network and a bypass circuit that is connected in parallel with the amplifier in order achieve input/output impedance matching regardless of the gain control state while maintaining low-noise amplification performance. In this variable gain amplification circuit, the output matching network matches the impedance on the output side of the amplifier when a high gain mode is selected and a matching correction circuit is connected in parallel with the output matching network and matches the impedance on the output side of the bypass circuit when a low gain mode is selected.

The variable gain amplification circuit of Japanese Unexamined Patent Application Publication No. 2014-27501 is also able to cause an input signal to be input to and amplified by the amplifier when the input signal is a low-power signal and to cause the input signal to bypass the amplifier when the input signal is a high-power signal.

However, there is a problem with the variable gain amplification circuit of Japanese Unexamined Patent Application Publication No. 2014-27501 in that the input signal is affected by the frequency characteristics of the input matching network when bypassing is performed and therefore the pass band characteristics have a high frequency dependence when input signals over a wide frequency band (that is, input signals of a plurality of frequency bands) are handled. That is, although the input matching network is provided in order to match the impedance on the input side of the variable gain amplification circuit, the input signal is input to the bypass circuit without being input to the amplifier after passing through the input matching network when bypassing is performed. Therefore, for an input signal of a frequency that is outside the pass band of the input matching network, pass loss occurs at that frequency when bypassing is performed. As a result, the pass loss that occurs differs depending on the frequency of the input signal and makes it difficult to use the circuit as a reception circuit that handles input signals of a plurality of frequency bands.

Furthermore, in the variable gain amplification circuit of Japanese Unexamined Patent Application Publication No. 2014-27501, when bypassing is performed, although the amplifier is turned off, the bypass circuit and the input terminal of the amplifier are connected in parallel with each other and therefore the input signal is also affected by frequency characteristics due to the input impedance of the amplifier. Therefore, there is also a problem in that the difference in pass loss increases depending on the frequency of the input signal.

Here, changing the input matching network in order to improve the frequency dependence of the bandpass characteristics when bypassing is performed may also be considered (for example, changing the input matching network itself, changing the number of elements making up the input circuit, changing the elements themselves, changing the constant values of the elements and so forth). However, if such a change was made, the input matching network would no longer be the optimal matching network for the amplifier. Consequently, the characteristics when an input signal is amplified by the amplifier (frequency dependence of bandpass characteristics) would no longer be secured.

SUMMARY OF THE INVENTION

Accordingly, preferred embodiments of the present invention provide amplification circuits including a bypass path in which a frequency dependence at a time of bypassing is significantly reduced or prevented compared with the related art.

An amplification circuit according to a preferred embodiment of the present invention includes a first switching circuit that includes one or more input terminals, a first output terminal and a second output terminal, and that puts the second output terminal into an open state of being open with respect to each of the one or more input terminals while selectively putting the first output terminal into a connected state of being connected to any one of the one or more input terminals or selectively puts the second output terminal into a connected state of being connected to any one of the one or more input terminals while putting the first output terminal into an open state of being open with respect to each of the one or more input terminals; a matching network that is connected to the first output terminal; an amplifier that is connected to an output side of the matching network; a second switching circuit that is connected to an output side of the amplifier and enters a non-conductive state when the first switching circuit puts the first output terminal into the open state and selectively puts the second output terminal into the connected state of being connected to any one of the one or more input terminals; and a bypass path that electrically connects the second output terminal and an output terminal of the second switching circuit.

With this configuration, a signal input to the first switching circuit is output via the second output terminal and the bypass path, which are isolated from the matching network, when bypassing is performed (when the first output terminal is put into the open state and the second output terminal is selectively connected to any one of the one or more input terminals in the first switching circuit). In other words, when bypassing is performed, the input signal does not pass through the matching network, which is connected to the input side of the amplifier, and therefore the effect of the frequency characteristics of the matching network on the input signal is significantly reduced or prevented.

In addition, since the second switching circuit is provided on the output side of the amplifier and the second switching circuit is turned off (is in a non-conductive state) when bypassing is performed, the effect of the frequency characteristics of the output impedance of the amplifier on the input signal that passes along the bypass path is also significantly reduced or prevented.

Furthermore, the matching network is connected to the amplifier but is not connected to the bypass path and therefore all that needs to be done is to design the matching network so as to be optimal for the amplifier.

As described above, a bypass-path-equipped amplification circuit is realized in which the frequency dependence when bypassing is performed is significantly reduced or prevented compared with the related art.

Here, the first switching circuit and the second switching circuit may be provided on a single semiconductor substrate.

With this configuration, the first switching circuit and the second switching circuit preferably are integrated into a single IC package and therefore the mounting area for components is reduced and a reduction in cost is achieved.

Furthermore, the first switching circuit may include a plurality of input terminals as the one or more input terminals, and the amplification circuit may further include a third switching circuit that includes an input terminal and a plurality of output terminals, and selectively connects the input terminal to any one of the plurality of output terminals; and a plurality of filters that are connected to the plurality of output terminals of the third switching circuit with a one-to-one correspondence; and the plurality of input terminals of the first switching circuit may be connected to output terminals of the plurality of filters with a one-to-one correspondence.

With this configuration, by switching the first switching circuit and the third switching circuit in a coupled manner, an input signal is selectively made to pass through any of the plurality of filters in order to extract only a signal of the required frequency band and selection is able to be performed to amplify the signal or to make the signal pass along the bypass path.

In addition, the first switching circuit and the second switching circuit may be provided on a single semiconductor substrate.

With this configuration, the first switching circuit and the second switching circuit are preferably integrated into a single IC package and therefore the mounting area for components is reduced and a reduction in cost is achieved.

Furthermore, the third switching circuit may also be provided on the single semiconductor substrate.

With this configuration, the third switching circuit is also integrated into the same IC package along with the first switching circuit and the second switching circuit and therefore the mounting area for components is further reduced and a further reduction in cost is achieved.

Alternatively, the third switching circuit may be provided on a semiconductor substrate that is different from the single semiconductor substrate.

With this configuration, since the third switching circuit is provided on a semiconductor substrate that is different from the semiconductor substrate on which the first switching circuit and the second switching circuit are provided, the individual substrates are able to be optimally designed and the freedom of design is increased.

Furthermore, the amplifier may be provided on the single semiconductor substrate on which the first switching circuit and the second switching circuit are provided.

With this configuration, the amplifier is also integrated into the same IC package along with the first switching circuit and the second switching circuit and therefore the mounting area for components is further reduced and a further reduction in cost is achieved.

In addition, the amplification circuit may further include a control circuit that controls the first switching circuit and the second switching circuit, where in a case in which a signal, which has been input to one of the one or more input terminals of the first switching circuit is to be amplified, the control circuit may control the first switching circuit so that the first output terminal of the first switching circuit is connected to the one of the one or more input terminals to which the signal has been input and so that the second output terminal of the first switching circuit is put into an open state and may control the second switching circuit so that the second switching circuit enters a conductive state, and in a case in which the signal, which has been input to one of the one or more input terminals of the first switching circuit is not to be amplified, the control circuit may control the first switching circuit so that the first output terminal of the first switching circuit is put into an open state and the second output terminal of the first switching circuit is connected to the one of the one or more input terminals and may control the second switching circuit so that the second switching circuit enters a non-conductive state.

With this configuration, the first switching circuit, the third switching circuit and the second switching circuit are controlled by the control circuit and an input signal is caused to pass through the appropriate filter in order to extract only the signal of the required frequency band, and then amplification or bypassing is able to be selectively performed in accordance with the power of the signal.

Furthermore, the first switching circuit may include a plurality of input terminals as the one or more input terminals and may include a diplexer or a triplexer that selectively outputs signals input to the plurality of input terminals in accordance with frequency bands of the signals.

With this configuration, the first switching circuit is preferably includes a diplexer or a triplexer and therefore switching (selection of an input signal) is performed in accordance with the frequency bands of signals input to the first switching circuit without the need for a control signal from the outside.

An amplification circuit according to a preferred embodiment of the present invention includes a first switching circuit that includes one or more input terminals, a first output terminal and a second output terminal, and that puts the second output terminal into an open state of being open with respect to each of the one or more input terminals while selectively putting the first output terminal into a connected state of being connected to any one of the one or more input terminals or selectively puts the second output terminal into a connected state of being connected to any one of the one or more input terminals while putting the first output terminal into an open state of being open with respect to each of the one or more input terminals; a matching network that is connected to the first output terminal; an amplifier that is connected to an output side of the matching network; a second switching circuit that is connected to an output side of the amplifier and enters a non-conductive state when the first switching circuit puts the first output terminal into the open state and selectively puts the second output terminal into the connected state of being connected to any one of the one or more input terminals; and a bypass path that electrically connects the second output terminal and an output terminal of the second switching circuit to each other, in which the amplifier is a variable-gain amplifier.

With this configuration, because the amplifier is a variable-gain amplifier, the input signal is able to be properly amplified in accordance with the size of the input signal.

An amplification circuit according to a preferred embodiment of the present invention includes a first switching circuit that includes one or more input terminals, a first output terminal and a second output terminal, and that puts the second output terminal into an open state of being open with respect to each of the one or more input terminals while selectively putting the first output terminal into a connected state of being connected to any one of the one or more input terminals or selectively puts the second output terminal into a connected state of being connected to any one of the one or more input terminals while putting the first output terminal into an open state of being open with respect to each of the one or more input terminals; a matching network that is connected to the first output terminal; an amplifier that is connected to an output side of the matching network; a second switching circuit that is connected to an output side of the amplifier and enters a non-conductive state when the first switching circuit puts the first output terminal into the open state and selectively puts the second output terminal into the connected state of being connected to any one of the one or more input terminals; and a bypass path that electrically connects the second output terminal and an output terminal of the second switching circuit to each other, in which the matching network is an impedance-variable matching network.

With this configuration, because the matching network has a variable impedance, impedance on the input side of the amplifier is properly matched according to the frequency of the input signal, and frequency dependence is further improved.

In an amplification circuit according to a preferred embodiment of the present invention, the matching network includes at least one of a first circuit including a plurality of first inductors connected in series and a switch connected in parallel to at least one of the plurality of first inductors, a second circuit including a plurality of first capacitors connected in series and a switch connected in parallel to at least one of the plurality of first capacitors, a third circuit including a plurality of second inductors connected in parallel and a switch connected in series to at least one of the plurality of second inductors, and a fourth circuit including a plurality of second capacitors connected in parallel and a switch connected in series to at least one of the plurality of capacitors.

With this configuration, a matching network with a variable impedance is able to be provided by a simple circuit including a switch and an inductor or a capacitor.

An amplification circuit according to a preferred embodiment of the present invention includes a first switching circuit that includes one or more input terminals, a first output terminal, a second output terminal, and a third output terminal, and that puts the second output terminal into an open state of being open with respect to each of the one or more input terminals while selectively putting one of the first output terminal and the third output terminal into a connected state of being connected to any one of the one or more input terminals or selectively puts the second output terminal into a connected state of being connected to any one of the one or more input terminals while putting the first output terminal and the third output terminal into an open state of being open with respect to each of the one or more input terminals; a first matching network that is connected to the first output terminal; a first amplifier that is connected to an output side of the first matching network; a second switching circuit that is connected to an output side of the first amplifier and enters a non-conductive state when the first switching circuit puts the first output terminal and the third output terminal into the open state and selectively puts the second output terminal into the connected state of being connected to any one of the one or more input terminals; a bypass path that electrically connects the second output terminal and an output terminal of the second switching circuit, and a second matching network connected to the third output terminal.

With this configuration, because two matching networks are selectively used, impedance on the input side of the amplifier is properly matched according to the frequency of the input signal, and frequency dependence is further improved.

The amplification circuit may further include a second amplifier connected to an output side of the second matching network; and a fourth switching circuit connected between an output terminal of the second amplifier, and a connection point of the first matching network and an input terminal of the first amplifier, wherein the fourth switching circuit enters a non-conductive state when the first switching circuit puts the third output terminal to an open state.

With this configuration, because the two amplifiers connected in series are selectively used, the input signal is able to be properly amplified in accordance with the size of the input signal.

In an amplification circuit according to a preferred embodiment of the present invention, at least one of the first amplifier and the second amplifier may preferably be a variable-gain amplifier.

With this configuration, because at least one of the two amplifiers is a variable-gain amplifier, the input signal is able to be properly amplified in accordance with the size of the input signal.

In an amplification circuit according to a preferred embodiment of the present invention, an output terminal of the first matching network and an output terminal of the second matching network preferably are connected to each other, and connected to an input terminal of the first amplifier.

With this configuration, because two matching networks are selectively used, impedance on the input side of the amplifier is properly matched according to the frequency of the input signal, and frequency dependence is further improved.

An amplification circuit according to a preferred embodiment of the present invention further includes a third switching circuit that includes an input terminal, a first group of plurality of output terminals, and a second group of plurality of output terminals and that performs at least one of selectively putting the input terminal into a state of being connected to at least one of the first group of plurality of output terminals and selectively putting the input terminal into a state of being connected to at least one of the second group of plurality of output terminals; a first amplifying unit connected to the first group of plurality of output terminals; and a second amplifying unit connected to the second group of plurality of output terminals, in which each of the first amplifying unit and the second amplifying unit includes the amplification circuit.

With this configuration, because the two amplifying units are provided in the amplification circuit, input signals of two different communication bands are able to be simultaneously amplified by using a proper filter. Therefore, a reception process corresponding to the carrier aggregation becomes possible.

In an amplification circuit according to a preferred embodiment of the present invention, the third switching circuit preferably includes a multiplexer that includes at least four filters with different frequency bands, and at least one of the four filters preferably includes a combination of an elastic wave filter and a passive component.

With this configuration, the third switching circuit includes a multiplexer. Therefore, switching (selection of an input signal) is performed in accordance with the frequency bands of signals input to the third switching circuit without the need for a control signal from the outside.

In an amplification circuit according to a preferred embodiment of the present invention, at least two of the first switching circuit, the matching network, the amplifier, and the second switching circuit are preferably mounted on one substrate.

With this configuration, because a plurality of configuration elements are mounted on one substrate and are incorporated as an IC package, a mounting area of the elements and components is able to be reduced and cost reduction is able to be achieved.

In an amplification circuit according to a preferred embodiment of the present invention, a component of the first switching circuit, the matching network, the amplifier, and the second switching circuit includes at least one passive component and at least one semiconductor element, and the at least one passive component and the at least one semiconductor element are mounted on the substrate.

With this configuration, because passive components and semiconductor elements are mounted on one substrate and are incorporated as an IC package, a mounting area of elements and components is able to be reduced and cost reduction is able to be achieved.

In an amplification circuit according to a preferred embodiment of the present invention, a component of the first switching circuit, the matching network, the amplifier, and the second switching circuit includes a plurality of semiconductor elements, and the plurality of semiconductor elements are mounted on the substrate by being stacked.

With this configuration, because a plurality of semiconductor elements are superposed and mounted on the substrate, the mounting area of the elements and components is able to be reduced further.

In an amplification circuit according to a preferred embodiment of the present invention, at least one of the first switching circuit, the matching network, the amplifier, and the second switching circuit is mounted on a first surface of the substrate, and at least one of a rest of the first switching circuit, the matching network, the amplifier, and the second switching circuit is mounted on a second surface opposite to the first surface of the substrate.

With this configuration, because a plurality of configuration elements are mounted on both surfaces of one substrate and are incorporated as an IC package, mounting of the elements and components is able to be highly integrated further.

In an amplification circuit according to a preferred embodiment of the present invention, a component of the first switching circuit, the matching network, the amplifier, and the second switching circuit includes at least one passive component and at least one semiconductor element, the at least one passive component is mounted on the first surface, and the at least one semiconductor element is mounted on the second surface.

With this configuration, because passive components and semiconductor elements are mounted on both surfaces of one substrate and are incorporated as an IC package, mounting of the elements and components are able to be highly integrated further.

In an amplification circuit according to a preferred embodiment of the present invention, at least one of the first switching circuit, the matching network, the amplifier, and the second switching circuit is mounted on the substrate, and at least one of a rest of the first switching circuit, the matching network, the amplifier, and the second switching circuit is mounted in the substrate.

With this configuration, because a plurality of configuration elements are mounted on not only the surface of one substrate but also inside the substrate and are incorporated as an IC package, mounting of the elements is able to be highly integrated further.

In an amplification circuit according to a preferred embodiment of the present invention, a component of the first switching circuit, the matching network, the amplifier, and the second switching circuit includes at least one passive component and at least one semiconductor element, the at least one passive component is mounted on the substrate, and the at least one semiconductor element is mounted in the substrate.

With this configuration, because passive components and semiconductor elements are mounted not only on the surface of one substrate but also inside the substrate and are incorporated as an IC package, mounting of the elements and components are able to be highly integrated further.

With various preferred embodiments of the present invention, bypass-path-equipped amplification circuits are provided in which the frequency dependence when bypassing is performed is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail by using the drawings. The preferred embodiments described hereafter each describe specific examples of the present invention. The numerical values, shapes, materials, constituent elements, the arrangement positions of the constituent elements, the ways in which the constituent elements are connected, the control procedure and so on included in the following preferred embodiments are merely examples and are not intended to limit the present invention. Furthermore, constituent elements not described in the independent claim that describes the most generic concept of the present invention among constituent elements in the following preferred embodiments are described as arbitrary constituent elements.

Preferred Embodiment 1

Figure 1:
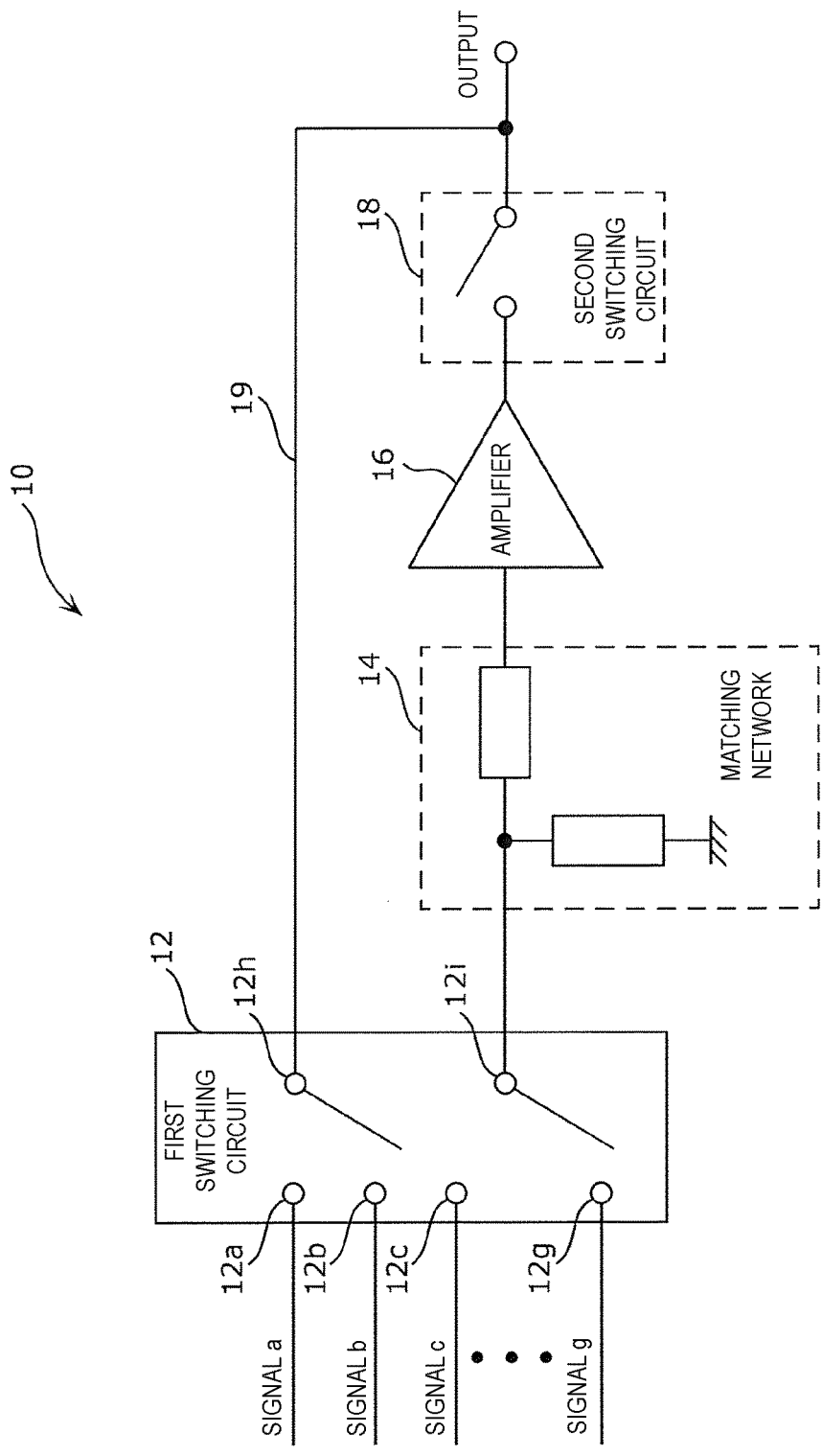
FIG. 1 is a circuit diagram of an amplification circuit of preferred embodiment 1 of the present invention.

FIG. 1 is a circuit diagram of an amplification circuit of preferred embodiment 1 of the present invention. The amplification circuit 10 preferably is a bypass-path-equipped amplification circuit and includes a first switching circuit 12, a matching network 14, an amplifier 16, a second switching circuit 18 and a bypass path 19.

The first switching circuit 12 is a circuit that includes one or more input terminals (here, input terminals 12a to 12g that correspond to signals a to g of a plurality of frequency bands), and a first output terminal 12i and a second output terminal 12h and that puts the second output terminal 12h into an open state of being open with respect to the input terminals 12a to 12g while selectively connecting the first output terminal 12i to any one of the input terminals 12a to 12g or selectively connects the second output terminal 12h to any one of the input terminals 12a to 12g while putting the first output terminal 12i into an open state of being open with respect to the input terminals 12a to 12g, and is, for example, a multiplexer includes an n-pole double throw (nPDT; n being the number of input terminals (here, frequency bands)) high-frequency switch. If the first switching circuit includes a single input terminal, such a first switching circuit will be provided for each of a plurality of frequency bands (that is, as many first switching circuits will be provided as there are bands). In this way, the isolation characteristics of the bands are improved.

The matching network 14 is an input matching network that is connected to the first output terminal 12i of the first switching circuit 12, is provided in order to match the impedance on the input side of the amplifier 16 and includes a capacitor and an inductor, for example.

The amplifier 16 is connected to the output side of the matching network 14 and preferably is, for example, a low-noise amplifier manufactured using a Si—Ge process.

The second switching circuit 18 is a switch that is connected to the output side of the amplifier 16 and is turned on (put into conductive state) or off (put into non-conductive state) in accordance with a control signal input from the outside, and is, for example, a single-pole single-throw (SPST) high-frequency switch.

The bypass path 19 is a signal path that electrically connects the second output terminal 12h of the first switching circuit 12 and an output terminal of the second switching circuit 18, and is, for example, a wiring pattern provided on a substrate.

Although an output matching network to match the impedance on the output side of the amplification circuit 10 is not provided in the amplification circuit 10 of this drawing, an output matching network may be provided between the amplifier 16 and the second switching circuit 18, if desired or necessary.

The thus-configured amplification circuit 10 of this preferred embodiment operates as follows.

In the case in which a signal, which is to be processed, input to one of the plurality of input terminals 12a to 12g of the first switching circuit 12 is a low-power signal (that is, when the input signal is to be amplified), the first switching circuit and the second switching circuit 18 operate as follows in accordance with a control signal from an externally provided control circuit (not illustrated).

That is, the first switching circuit 12 connects the first output terminal 12i to the one of the input terminals 12a to 12g to which the signal to be processed is input and puts the second output terminal 12h into an open state. In addition, the second switching circuit 18 is turned on. As a result, the signal to be processed that has been input to one of the plurality of input terminals 12a to 12g of the first switching circuit 12 passes through the matching network 14, which is isolated from the bypass path 19, is input to the amplifier 16, is amplified by the amplifier 16, and then is output via the second switching circuit 18.

On the other hand, in the case in which a signal, which is to be processed, input to one of the plurality of input terminals 12a to 12g of the first switching circuit 12 is a high-power signal (that is, when the input signal is to be made to pass along the bypass path 19 without being amplified), the first switching circuit 12 and the second switching circuit 18 operate as follows in accordance with a control signal from an externally provided control circuit (not illustrated).

That is, the first switching circuit 12 puts the first output terminal 12i into an open state and connects the second output terminal 12h to the one of the input terminals 12a to 12g to which the signal to be processed is input. In addition, the second switching circuit 18 is turned off. Consequently, the signal to be processed that has been input to one of the plurality of input terminals 12a to 12g of the first switching circuit 12 is output via the second output terminal 12h and the bypass path 19, which are isolated from the matching network 14 and the amplifier 16.

Thus, with the amplification circuit 10 of this preferred embodiment, a signal to be processed that is input to the first switching circuit 12 is output via the second output terminal 12h and the bypass path 19, which are isolated from the matching network 14 (isolated by amount of isolation between the first output terminal 12i and the second output terminal 12h) when bypassing is performed. In other words, when bypassing is performed, the input signal does not pass through the matching network 14, which is connected to the input side of the amplifier 16, and therefore the effect of the frequency characteristics of the matching network 14 on the input signal is significantly reduced or prevented.

Furthermore, since the second switching circuit 18 is provided on the output side of the amplifier 16 and the second switching circuit 18 is turned off when bypassing is performed, the effect of the frequency characteristics of the output impedance of the amplifier 16 on an input signal that passes along the bypass path 19 is also significantly reduced or prevented (significantly reduced or prevented by same amount of isolation as when second switching circuit 18 is off).

Furthermore, the matching network 14 is connected to the amplifier 16 and is not connected to the bypass path 19 (is isolated by amount of isolation between the first output terminal 12i and the second output terminal 12h) and therefore all that needs to be done is to design the matching network so as to be optimal for the amplifier 16 (optimal frequency characteristics taking gain, noise factor and distortion of amplifier 16 into account).

Figure 2:
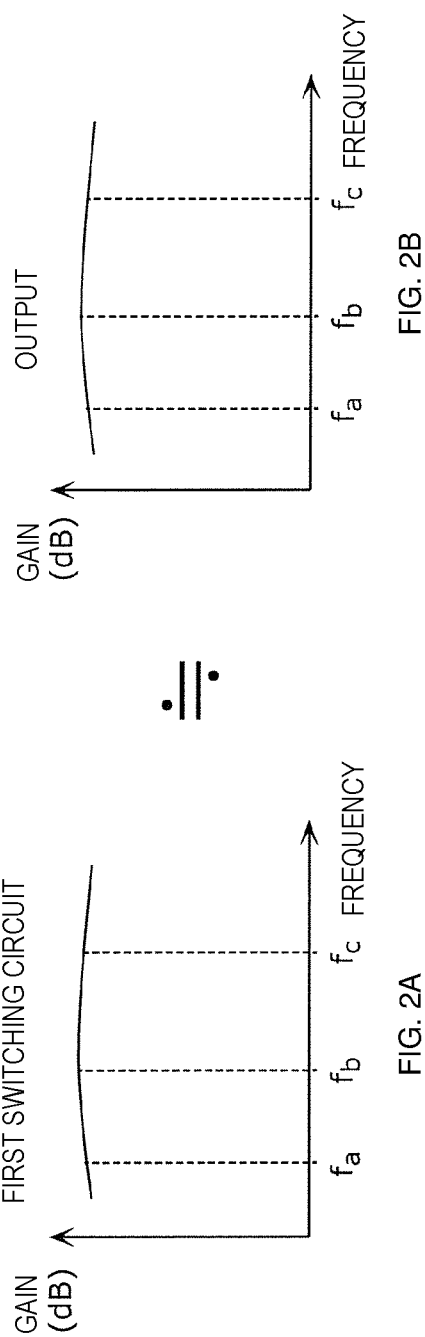
FIGS. 2A and 2B illustrate overviews of bandpass characteristics, when bypassing is performed, of the amplification circuit of preferred embodiment 1 of the present invention.

FIGS. 2A and 2B illustrate overviews of bandpass characteristics (frequency characteristics), when bypassing is performed, of the amplification circuit 10 of this preferred embodiment. FIG. 2A illustrates an overview of the bandpass characteristics of the first switching circuit 12 and FIG. 2B illustrates bandpass characteristics, when bypassing is performed, of the entire amplification circuit 10. In FIGS. 2A and 2B, the gains (dB) at frequencies fa, fb and fc of signals a to c input to three input terminals 12a to 12c of the first switching circuit 12 are illustrated.

The difference in gain (that is, the difference in pass loss) across a wide range of frequencies is smaller in bandpass characteristics illustrated in FIGS. 2A and 2B than in the bandpass characteristics of a bypass-path-equipped amplification circuit of the related art. In order to enable easy understanding of this, a bypass-path-equipped amplification circuit of the related art and the bandpass characteristics thereof will be described for reference.

Figure 3:
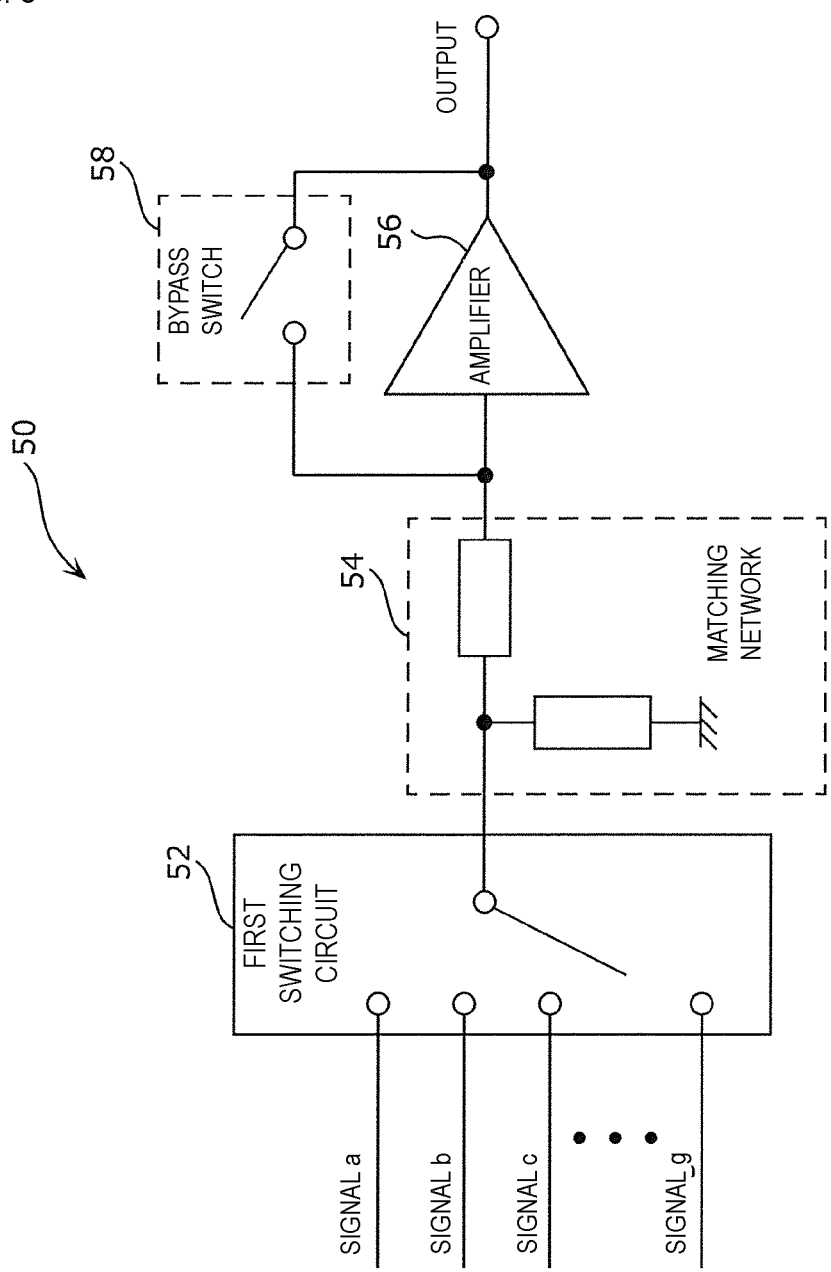
FIG. 3 is a circuit diagram of a bypass-path-equipped amplification circuit of the related art.

FIG. 3 is a circuit diagram of a typical bypass-path-equipped amplification circuit 50 of the related art. The amplification circuit 50 includes a first switching circuit 52, a matching network 54, an amplifier 56 and a bypass switch 58.

The first switching circuit 52 selects one input terminal, from among a plurality of input terminals, to which a signal is input.

The bypass switch 58 is turned off in the case in which the input signal is a low-power signal (that is, when the input signal is to be amplified). As a result, the signal selected by the first switching circuit 52 passes through the matching network 54, is input to the amplifier 56, is amplified by the amplifier 56 and is then output. On the other hand, in the case in which the input signal is a high-power signal (that is, when the input signal is to pass along the bypass path 19 and not be amplified), the bypass switch 58 is turned on. Consequently, the signal selected by the first switching circuit 52 is output via the bypass switch 58 after passing through the matching network 54.

Thus, in the bypass-path-equipped amplification circuit 50 of the related art, when bypassing is performed, an input signal is output via the bypass switch 58 after passing through the matching network 54. Therefore, in the bypass-path-equipped amplification circuit 50 of the related art, the bandpass characteristics when bypassing is performed are affected by both the bandpass characteristics of the matching network 54 and the bandpass characteristics of the bypass switch 58.

Figure 4:
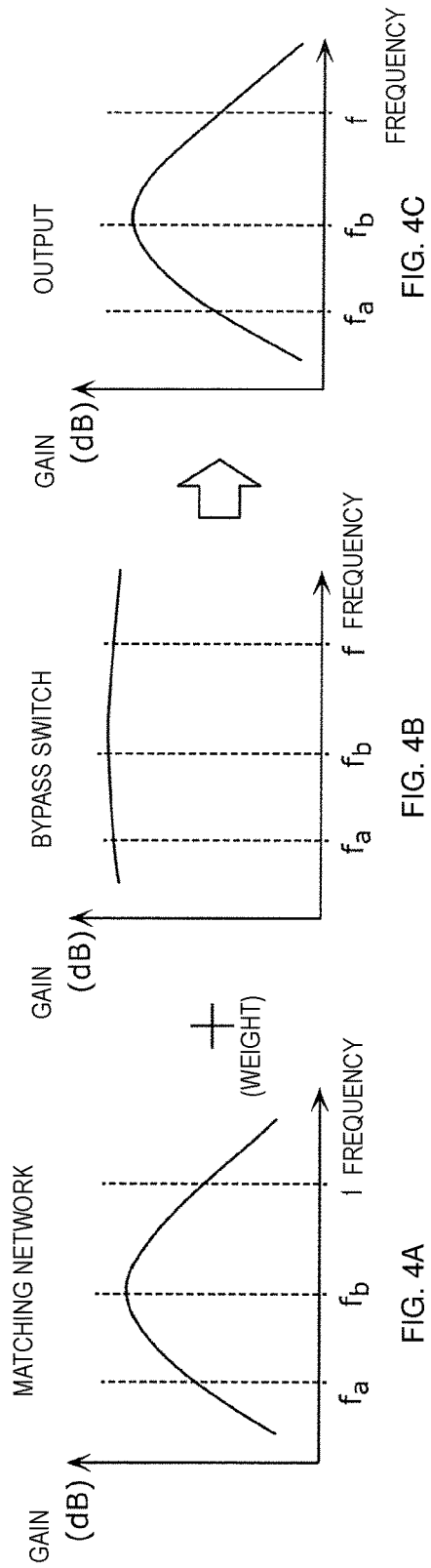
FIGS. 4A to 4C illustrate overviews of bandpass characteristics, when bypassing is performed, of the bypass-path-equipped amplification circuit of the related art.

FIGS. 4A to 4C illustrate overviews of the bandpass characteristics (frequency characteristics), when bypassing is performed, of the bypass-path-equipped amplification circuit 50 of the related art illustrated in FIG. 3. FIG. 4A illustrates an overview of the bandpass characteristics of the matching network 54, FIG. 4B illustrates an overview of the bandpass characteristics of the bypass switch 58 and FIG. 4C illustrates an overview of the bandpass characteristics, when bypassing is performed, of the entire amplification circuit 50. Here, it is illustrated that the bandpass characteristics, when bypassing is performed, of the entire amplification circuit 50 (FIG. 4C) is obtained by combining the bandpass characteristics of the matching network 54 (FIG. 4A) and the bandpass characteristics of the bypass switch 58 (FIG. 4B). The frequencies along the horizontal axis are the same as in FIGS. 2A and 2B.

In the bypass-path-equipped amplification circuit 50 of the related art, since the input signal passes through the matching network 54 when bypassing is performed, the input signal is affected by the frequency characteristics of the matching network 54 as illustrated in FIG. 4A (that is, frequency characteristics having a narrow pass band) and consequently the bypass-path-equipped amplification circuit 50 of the related art has bandpass characteristics having a narrow pass band as illustrated in FIG. 4C.

As is clear from comparing FIGS. 2A and 2B and FIGS. 4A to 4C, the frequency dependency when bypassing is performed is significantly reduced or prevented in the amplification circuit 10 of this preferred embodiment compared with the amplification circuit 50 of the related art.

In the amplification circuit 10 of this preferred embodiment, the respective circuit blocks may be defined individual IC packages or be defined by a shared IC package.

For example, the first switching circuit 12, the matching network 14, the amplifier 16 and the second switching circuit 18 may be defined by individual IC packages. That is, the first switching circuit 12, the matching network 14, the amplifier and the second switching circuit 18 may be provided on individual semiconductor substrates. At this time, for example, the first switching circuit 12 and the second switching circuit 18 would be manufactured using a silicon-on-insulator (SOI) process and the amplifier 16 would be manufactured using a Si—Ge process.

Figure 5:
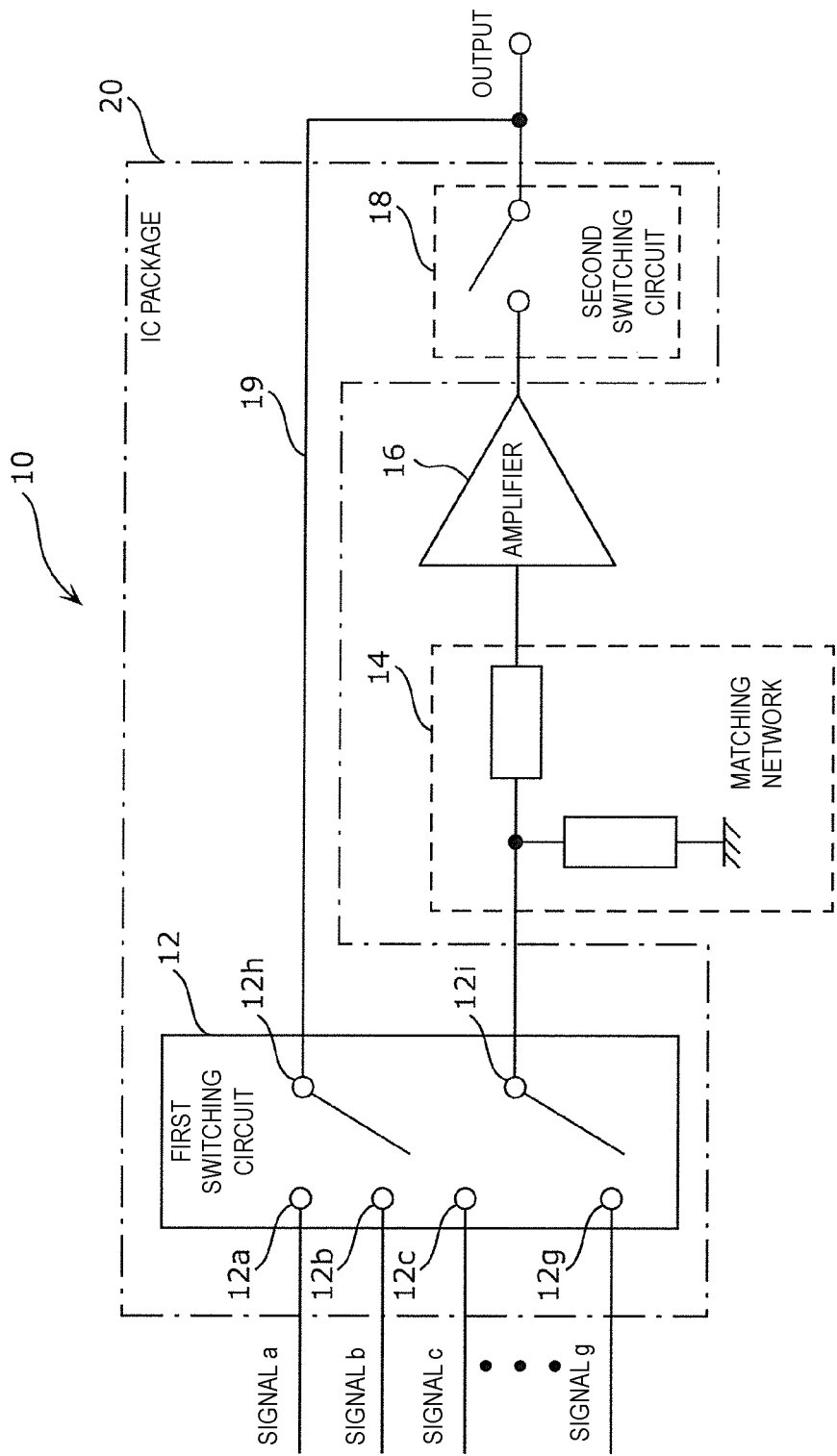
FIG. 5 illustrates an example of a package of the amplification circuit of preferred embodiment 1 of the present invention.

As illustrated in FIG. 5, the first switching circuit 12 and the second switching circuit 18 may defined as a single IC package 20. That is, the first switching circuit 12 and the second switching circuit 18 may be provided on a single semiconductor substrate. At this time, the IC package 20 would be manufactured using a SOI process, for example. Thus, the mounting area for the components of the amplification circuit 10 is reduced and a reduction in cost is achieved.

Figure 6:
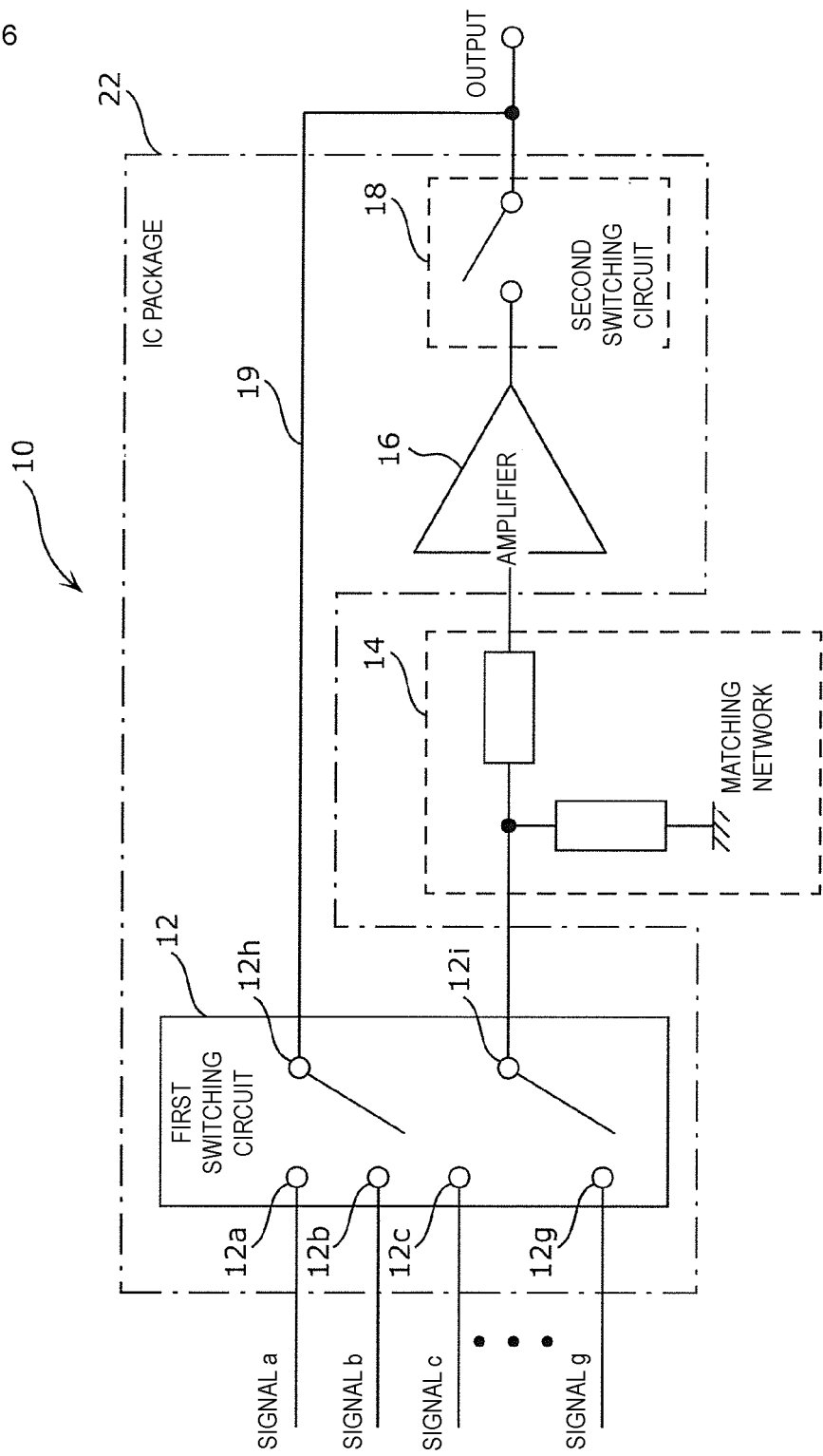
FIG. 6 illustrates another example of a package of the amplification circuit of preferred embodiment 1 of the present invention.

As illustrated in FIG. 6, along the first switching circuit 12 and the second switching circuit 18, the amplifier 16 may also be defined by a single IC package 22. That is, the first switching circuit 12, the second switching circuit 18 and the amplifier 16 may be provided on a single semiconductor substrate. At this time, the IC package 22 would be manufactured using a SOI process, for example. Thus, the mounting area for the components of the amplification circuit 10 is further reduced and a further reduction in cost is achieved.

Preferred Embodiment 2

Next an amplification circuit of preferred embodiment 2 of the present invention will be described.

Figure 7:
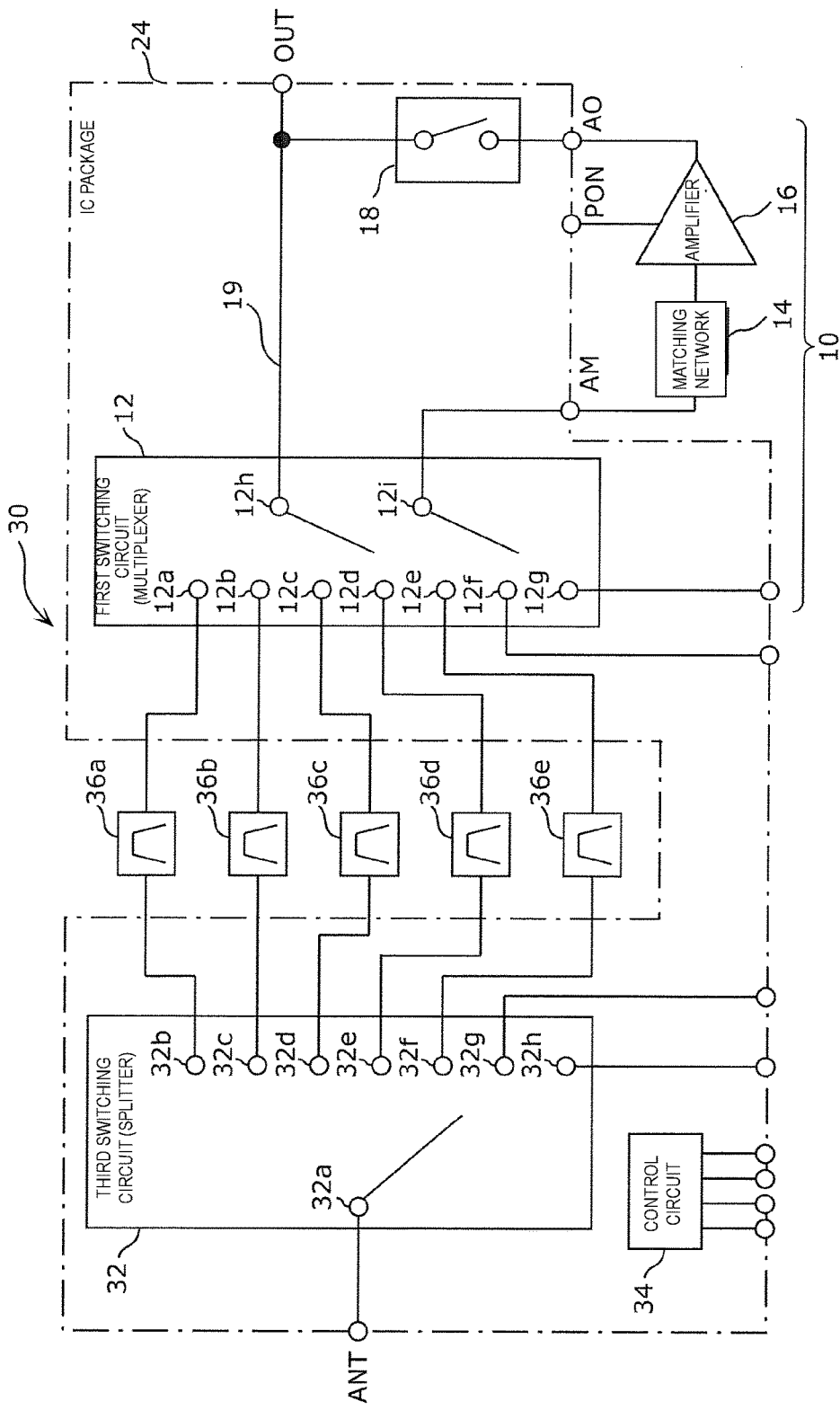
FIG. 7 is a circuit diagram of an amplification circuit of preferred embodiment 2 of the present invention.

FIG. 7 is a circuit diagram of an amplification circuit of preferred embodiment 2 of the present invention. The amplification circuit 30 is a high-frequency module that selects and amplifies one signal from among signals of a plurality of frequency bands received by an antenna and includes a third switching circuit 32, a control circuit 34 and filters 36a to 36e in addition to the constituent components of the amplification circuit 10 of preferred embodiment 1.

The third switching circuit 32 is a circuit that includes an input terminal 32a and a plurality of output terminals 32b to 32h and that selectively connects the input terminal 32a to any of the plurality of output terminals 32b to 32h in accordance with a control signal input from the control circuit 34, and is, for example, a splitter includes a single pole n throw (SPnT; n being the number of output terminals (here, number of frequency bands)) high-frequency switch.

The filters 36a to 36e are filter circuits that are connected with a one-to-one correspondence to the output terminals 32b to 32f of the third switching circuit 32 and are each, for example, a band pass filter, a low pass filter or a high pass filter that allows just a signal of the corresponding frequency band to pass therethrough. The output terminals of the filters 36a to 36e are connected with a one-to-one correspondence to input terminals 12a to 12e of the first switching circuit 12. Filters may be connected between the output terminal 32f and the input terminal 12f and between the output terminal 32h and the input terminal 12g, as necessary. The output terminal 32g and the input terminal 12f and the output terminal 32h and the input terminal 12g may be directly electrically connected to each other with wiring lines. The output terminal 32g and the input terminal 12f and the output terminal 32h and the input terminal 12g may be unconnected (open terminals). Termination impedance elements (for example, 50Ω resistors) may be connected to the output terminal 32g, the output terminal 32h, the input terminal 12f and the input terminal 12g.

The control circuit 34 outputs control signals to the first switching circuit 12, the third switching circuit 32 and the second switching circuit 18, and thus switches the first switching circuit 12 and the third switching circuit 32 in a coupled manner in accordance with the frequency band of an input signal to be processed and switches the second switching circuit 18 on or off in accordance with the magnitude of the power of the input signal (that is, in accordance with whether the input signal is to be amplified).

In the amplification circuit 30, the first switching circuit 12, the third switching circuit 32, the second switching circuit 18 and the control circuit 34 are provided in a single IC package 24. That is, the first switching circuit 12, the third switching circuit 32, the second switching circuit 18 and the control circuit 34 are provided on a single semiconductor substrate. The IC package 24, for example, preferably may be manufactured using an SOI process and includes, as main terminals, an ANT terminal that is connected to the input terminal 32a of the third switching circuit 32, an AM terminal that is connected to the first output terminal 12i of the first switching circuit 12, a PON terminal that supplies power to the amplifier 16, an AO terminal that is connected to the input terminal of the second switching circuit 18 and an OUT terminal that is connected to the second output terminal 12h of the first switching circuit 12 and the output terminal of the second switching circuit 18.

The thus-configured amplification circuit 30 of this preferred embodiment operates as follows.

Upon determining that an input signal to be processed is a signal of a first frequency band (frequency band handled by the filter 36a) among seven frequency bands and that the input signal is a low-power signal (that is, the input signal is to be amplified), the control circuit 34 controls the third switching circuit 32 to connect the input terminal 32a to the output terminal 32b, controls the first switching circuit 12 to connect the first output terminal 12i to the input terminal 12a and put the second output terminal 12h into an open state and switches the second switching circuit 18 on. Thus, a low-power input signal, which is input to the ANT terminal, passes through the third switching circuit 32 from the input terminal 32a to the output terminal 32b, passes through the filter 36a, is input to the input terminal 12a of the first switching circuit 12, passes through the AM terminal from the first output terminal 12i of the first switching circuit 12, passes through the matching network 14, is input to the amplifier 16, is amplified by the amplifier 16, passes through the AO terminal, passes through the second switching circuit 18 and is output from the OUT terminal.

On the other hand, upon determining that an input signal to be processed is a signal of the first frequency band (frequency band handled by the filter 36a) among the seven frequency bands and that the input signal is a high-power signal (that is, the input signal is not to be amplified and is to be made to pass along the bypass path 19), the control circuit 34 controls the third switching circuit 32 to connect the input terminal 32a to the output terminal 32b, controls the first switching circuit 12 to put the first output terminal 12i into an open state and to connect the second output terminal 12h to the input terminal 12a and switches the second switching circuit 18 off. Thus, a high-power input signal, which is input to the ANT terminal, passes through the third switching circuit 32 from the input terminal 32a to the output terminal 32b, passes through the first switching circuit 12 from the input terminal 12a to the second output terminal 12h, passes along the bypass path 19, which is isolated from the matching network 14 and the amplifier 16, and is output from the OUT terminal.

In the case in which the input signal to be processed is a signal of another frequency band among the seven frequency bands (for example, the frequency band handled by the filter 36b), the control circuit 34 controls the third switching circuit 32 to connect the input terminal 32a to the corresponding output terminal (for example, the output terminal 32c), controls the first switching circuit 12 to connect either the first output terminal 12i or the second output terminal 12h to the corresponding input terminal (for example, the input terminal 12b) and to put the other of the first output terminal 12i and the second output terminal 12h into an open state in accordance with the magnitude of the power of the input signal. Thus, the signal input to the ANT terminal passes through the third switching circuit 32, passes through the corresponding filter (for example, the filter 36b), is input to the first switching circuit 12, and then is amplified by the amplifier 16 and output or passes along the bypass path 19 and is output in accordance with the magnitude of the power of the input signal.

Thus, the amplification circuit 30 of this preferred embodiment includes an amplification circuit 10 that is the same as that of preferred embodiment 1 as a rear-stage circuit. Therefore, the same effect as with preferred embodiment 1 is exhibited.

Furthermore, in addition to the amplification circuit 10 of preferred embodiment 1, the amplification circuit 30 of this preferred embodiment includes, as a front-stage circuit, the third switching circuit 32, which switches a signal in a coupled manner with the first switching circuit 12 of the amplification circuit 10, the filters 36a to 36e that are provided between the third switching circuit 32 and the first switching circuit 12, and the control circuit 34 that controls the first switching circuit 12, the third switching circuit 32 and the second switching circuit 18. Thus, a signal input to the ANT terminal is made to pass through the appropriate filter among the filters 36a to 36e in order to extract only the signal of the required frequency band, and a selection is made to amplify the signal with the amplifier 16 or to make the signal pass along the bypass path 19.

In this preferred embodiment, the first switching circuit 12, the third switching circuit 32, the second switching circuit 18 and the control circuit 34 are preferably provided in the single IC package 24, but may instead be provided in two or more IC packages. For example, the first switching circuit 12 and the second switching circuit 18 may be provided by one IC package (provided on one semiconductor substrate) and the third switching circuit 32 and the control circuit 34 may be provided by another IC package (provided on another semiconductor substrate). In this way, the individual semiconductor substrates are able to be optimally designed and the freedom of design is increased.

Furthermore, the amplifier 16 may be provided on a semiconductor substrate on which the first switching circuit 12, the third switching circuit 32, the second switching circuit 18 and the control circuit 34 are provided (provided in same IC package) or may be provided on a semiconductor substrate on which only the first switching circuit 12 and the second switching circuit 18 are provided (provided in same IC package). At this time, for example, the IC package including the amplifier 16 would be manufactured using an SOI process. Thus, the mounting area for the components forming the amplification circuit 30 is reduced and a reduction in cost is achieved.

An amplification circuit according to a preferred embodiment of the present invention has been described above on the basis of preferred embodiments 1 and 2, but the present invention is not limited to these preferred embodiments. Various modifications to the preferred embodiments and other preferred embodiments formed by combining some of the constituent elements of the preferred embodiments are to be included in the scope of the present invention so long as the modifications and other preferred embodiments do not depart from the gist of the present invention.

For example, the first switching circuit 12 and the third switching circuit 32 are each preferably defined by a high-frequency switch as an example, but may instead be defined by a high-frequency switching circuit that includes a filter such as a diplexer (or a duplexer) or a triplexer.

Figure 8A:
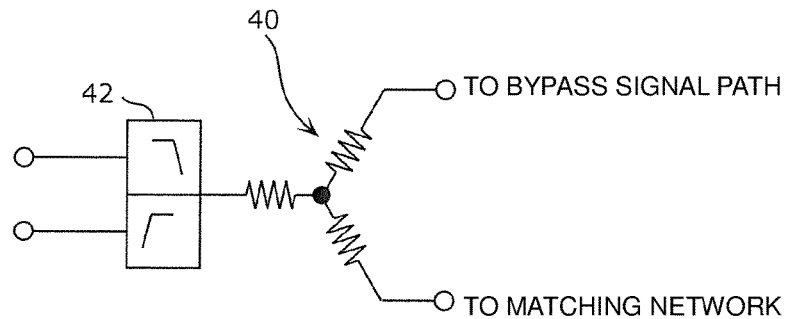
FIGS. 8A to 8C illustrate examples in which a first switching circuit of an amplification circuit includes a diplexer or a triplexer.
Figure 8B:
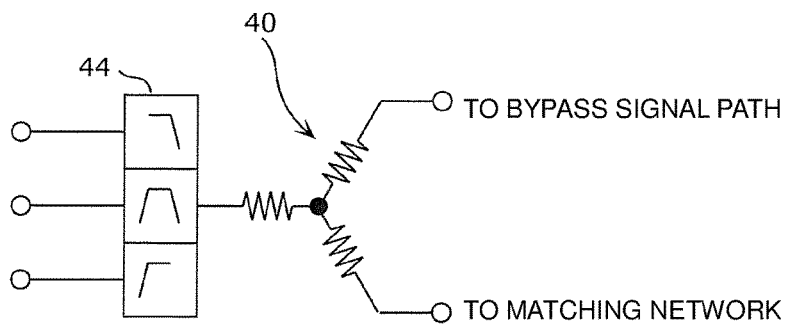
Figure 8C:
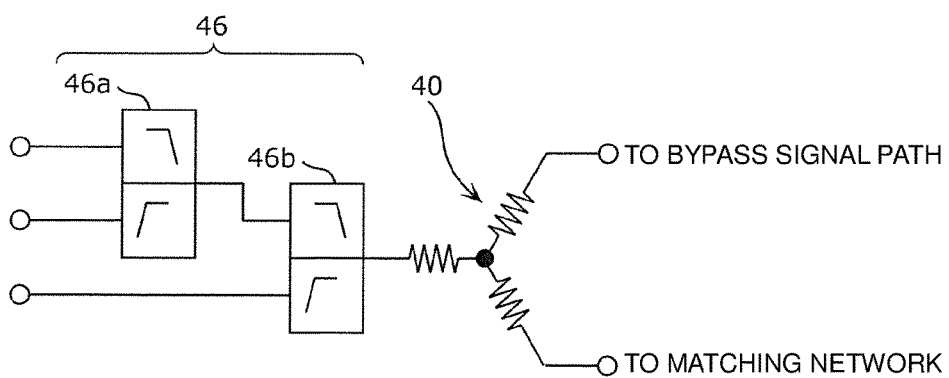

FIGS. 8A to 8C illustrate examples in which the first switching circuit 12 includes a diplexer or a triplexer. FIG. 8A illustrates a two-input two-output switching circuit that includes a diplexer 42 and a divider 40. A high-frequency switch (not illustrated) may be connected to each of the two output terminals of the divider 40. With this configuration, either one of input signals of different frequency bands input to the two input terminals may be selected and output by the diplexer 42 and output to a bypass signal path or a matching network via the divider 40.

FIG. 8B illustrates a three-input two-output switching circuit that includes a triplexer 44 and the divider 40. A high-frequency switch (not illustrated) may be connected to each of the two output terminals of the divider 40. With this configuration, any one of input signals of different frequency bands input to the three input terminals may be selected and output by the triplexer 44 and output to a bypass signal path or a matching network via the divider 40.

FIG. 8C illustrates a three-input two-output switching circuit that includes a triplexer 46, which includes two diplexers 46a and 46b, and the divider 40. A high-frequency switch (not illustrated) may be connected to each of the two output terminals of the divider 40.

With this configuration, any one of input signals of different frequency bands input to the three input terminals may be selected and output by the triplexer 46 and output to a bypass signal path or a matching network via the divider 40.

Similarly, the third switching circuit 32 may also include a filter such as a diplexer, a triplexer or a combination of diplexers and triplexers. Accordingly, the first switching circuit 12 and the third switching circuit 32 include a filter such as a diplexer or a triplexer, and switching (selection of input signal) is performed in accordance with the frequency band of an input signal without the need for a control signal from the outside.

Figure 9:
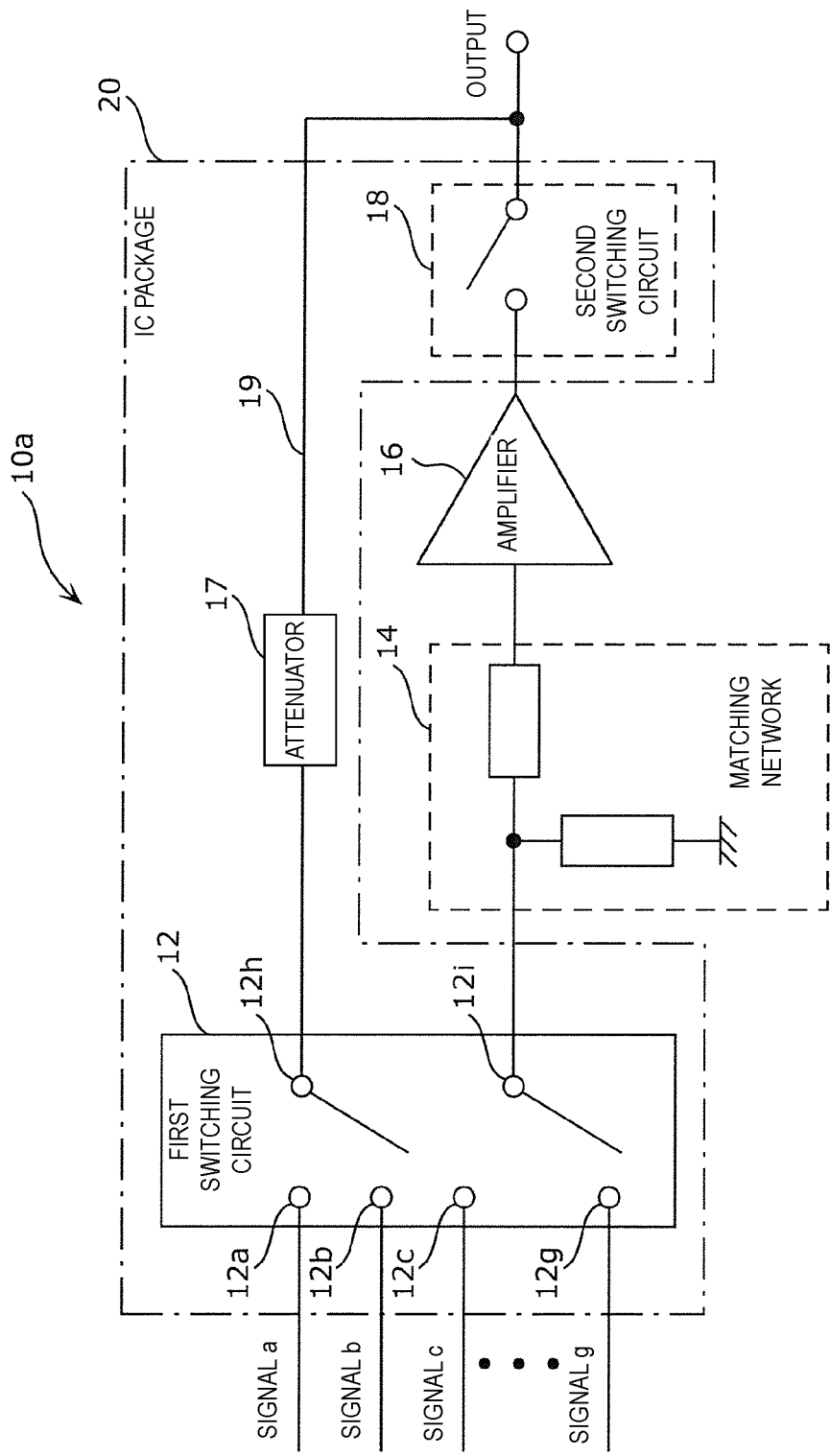
FIG. 9 is a circuit diagram of an amplification circuit according to a modification of a preferred embodiment of the present invention.

Furthermore, in preferred embodiments 1 and 2, the bypass path 19 preferably includes just a signal path, but, not limited to this, an attenuator may be provided along the signal path. FIG. 9 is a circuit diagram of an amplification circuit 10a according to a modification defined by providing an attenuator 17 along the bypass path 19 of the amplification circuit 10 illustrated in FIG. 5. The attenuator 17 is a variable attenuator that attenuates a signal and, for example, is able to change the amount of attenuation in accordance with a control signal from the outside. According to the amplification circuit 10a, which includes such an attenuator 17, the level of insertion loss when an input signal is made to pass along the bypass path 19 is able to be changed.

Furthermore, in preferred embodiment 2, the control circuit 34 is provided in the same IC package as the third switching circuit 32, but the control circuit 34 may instead be provided in a different IC package to the third switching circuit 32. Thus, the control circuit 34 is able to be optimally designed independently of the other circuits and the freedom of design is increased.

Preferred Embodiment 3

Next an amplification circuit of preferred embodiment 3 of the present invention will be described.

Figure 10:
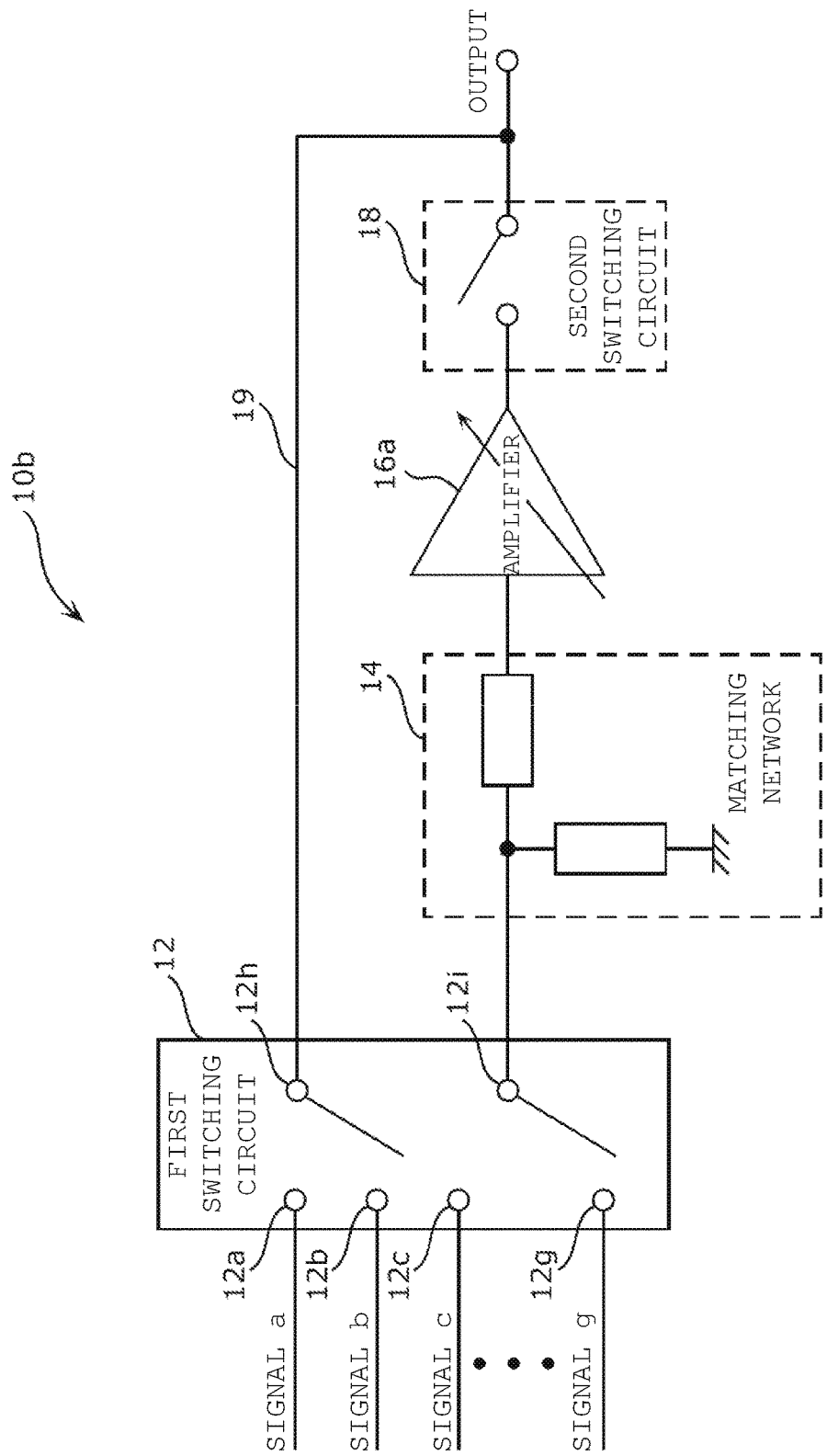
FIG. 10 is a circuit diagram of an amplification circuit of preferred embodiment 3 of the present invention.

FIG. 10 is a circuit diagram of an amplification circuit 10b of preferred embodiment 3 of the present invention. The amplification circuit 10b is a high-frequency module that selects and amplifies one signal from among signals of a plurality of frequency bands received by an antenna. The amplification circuit 10b includes a configuration in which, in the amplification circuit 10 of preferred embodiment 1, the amplifier 16 is replaced with an amplifier 16a which is a variable-gain amplifier. Elements which are the same as those in preferred embodiment 1 are denoted by the same reference symbols, and primarily different points will be described.

The amplifier 16a is connected to the output side of the matching network 14 and is preferably, for example, a low-noise amplifier of variable gain manufactured using an Si—Ge process. The gain of the amplifier 16a is adjusted by an externally provided control circuit (not illustrated).

For example, in the first switching circuit 12, when the first output terminal 12i is connected to one of the input terminals 12a to 12g in which a signal to be processed is input and the second output terminal 12h enters the open state and also the second switching circuit 18 is switched on, the gain of the amplifier 16a is adjusted in accordance with the size of the signal input to amplifier 16a. The adjustment of the gain is performed by an externally provided control circuit (not illustrated), for example.

As described above, because the amplifier 16a of variable gain is provided in the amplification circuit 10b of preferred embodiment 3, there is an effect that, in addition to the effect exhibited by the amplification circuit 10 of preferred embodiment 1, the input signal is able to be properly amplified in accordance with the size of the input signal.

Preferred Embodiment 4

Next an amplification circuit of preferred embodiment 4 of the present invention will be described.

Figure 11:
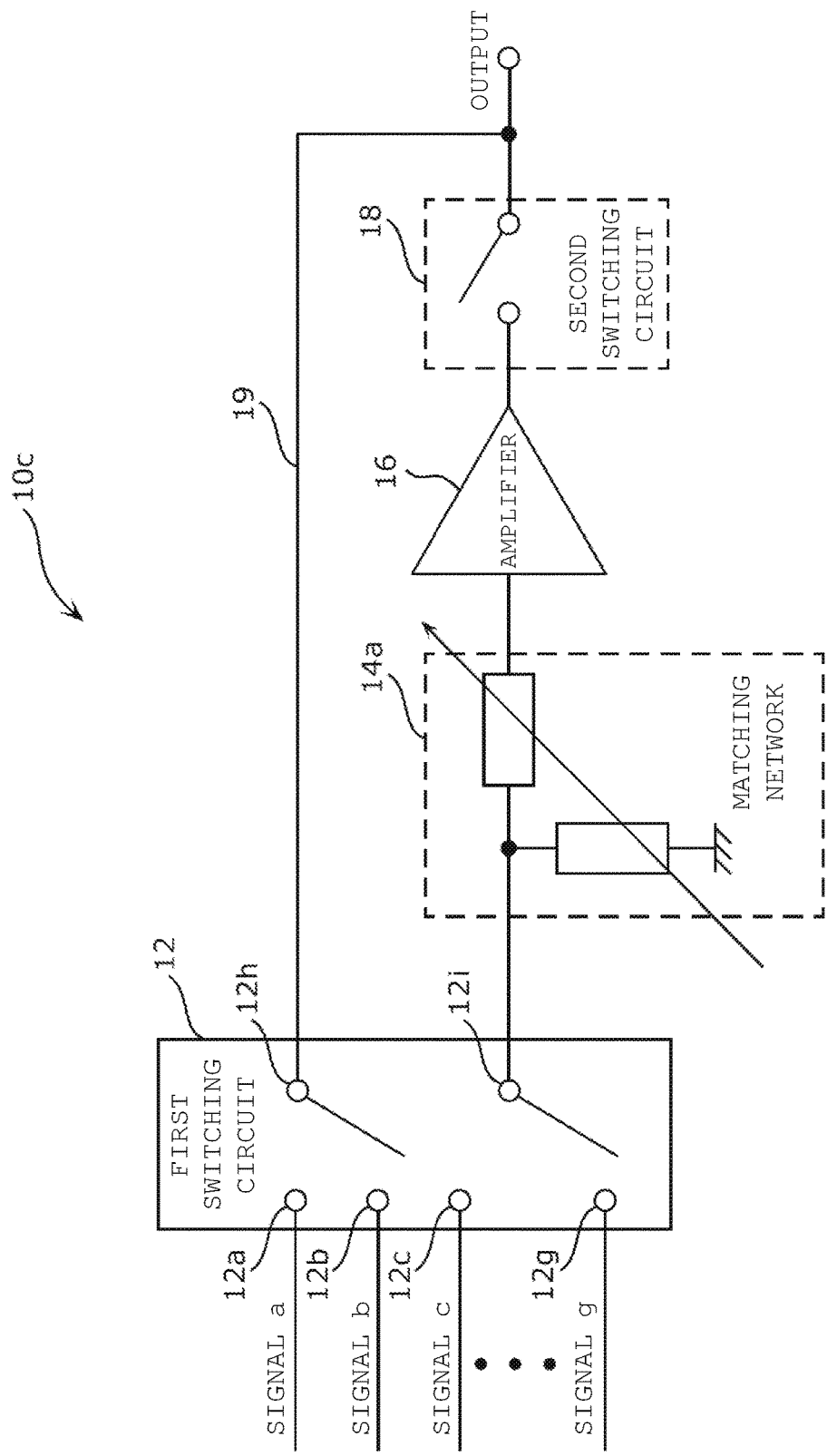
FIG. 11 is a circuit diagram of an amplification circuit of preferred embodiment 4 of the present invention.

FIG. 11 is a circuit diagram of an amplification circuit 10c of preferred embodiment 4 of the present invention. The amplification circuit 10c is a high-frequency module that selects and amplifies one signal from among signals of a plurality of frequency bands received by an antenna. The amplification circuit 10c includes a configuration in which, in the amplification circuit 10 of preferred embodiment 1, the matching network 14 is replaced with an impedance-variable matching network 14a. Elements which are the same as those in preferred embodiment 1 are denoted by the same reference symbols, and primarily different points will be described.

Preferably, the matching network 14a is an impedance-variable input matching network that is connected to the first output terminal 12i of the first switching circuit 12, is provided in order to match the impedance on the input side of the amplifier 16, and includes a variable-impedance element, for example. The impedance of the matching network 14a is adjusted by an externally provided control circuit (not illustrated).

FIG. 12A to FIG. 12F are diagrams illustrating examples of variable-impedance elements 140, 141, 142, 143, 144, and 146 of the matching network 14a illustrated in FIG. 11.

Figure 12A:
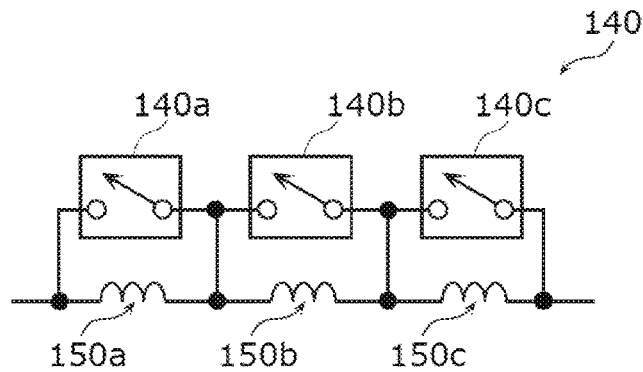
FIG. 12A is a diagram illustrating an example of a variable-impedance element of a matching network illustrated in FIG. 11.

The variable-impedance element 140 illustrated in FIG. 12A includes a first circuit defined by a plurality of first inductors 150a to 150c that are connected in series, and switches that are connected in parallel to at least one of the plurality of first inductors 150a to 150c (in this case, switches 140a to 140c that are connected in parallel to the first inductors 150a to 150c). The impedance of the variable-impedance element 140 is changed by the switches 140a to 140c, which are on and off controlled by an externally provided control circuit (not illustrated).

Figure 12B:
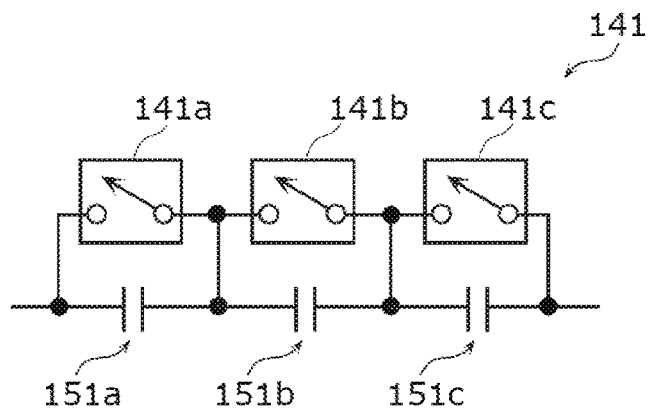
FIG. 12B is a diagram illustrating another example of a variable-impedance element of a matching network illustrated in FIG. 11.

The variable-impedance element 141 illustrated in FIG. 12B includes a second circuit defined by a plurality of first capacitors 151a to 151c that are connected in series, and switches that are connected in parallel to at least one of the plurality of first capacitors 151a to 151c (in this case, switches 141a to 141c that are connected in parallel to the first capacitors 151a to 151c). The impedance of the variable-impedance element 141 is changed by the switches 141a to 141c, which are on and off controlled by an externally provided control circuit (not illustrated).

Figure 12C:
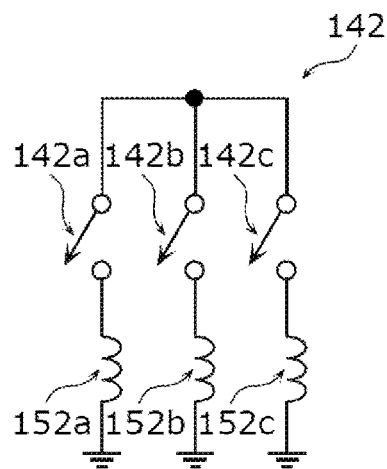
FIG. 12C is a diagram illustrating another example of a variable-impedance element of a matching network illustrated in FIG. 11.

The variable-impedance element 142 illustrated in FIG. 12C includes a third circuit defined by a plurality of second inductors 152a to 152c that are connected in parallel, and switches that are connected in series to at least one of the plurality of second inductors 152a to 152c (in this case, switches 142a to 142c that are connected in series to the second inductors 152a to 152c). The impedance of the variable-impedance element 142 is changed by the switches 142a to 142c, which are on and off controlled by an externally provided control circuit (not illustrated).

Figure 12D:
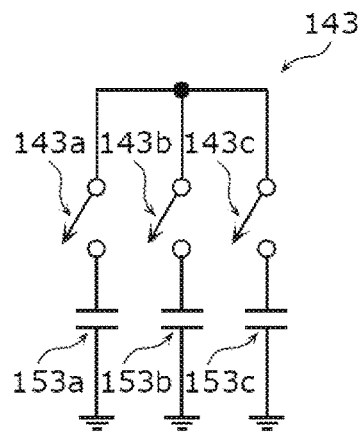
FIG. 12D is a diagram illustrating another example of a variable-impedance element of a matching network illustrated in FIG. 11.

The variable-impedance element 143 illustrated in FIG. 12D includes a fourth circuit defined by a plurality of second capacitors 153a to 153c that are connected in parallel, and switches that are connected in series to at least one of the plurality of second capacitors 153a to 153c (in this case, switches 143a to 143c that are connected in series to the second capacitors 153a to 153c). The impedance of the variable-impedance element 143 is changed by the switches 143a to 143c, which are on and off controlled by an externally provided control circuit (not illustrated).

Figure 12E:
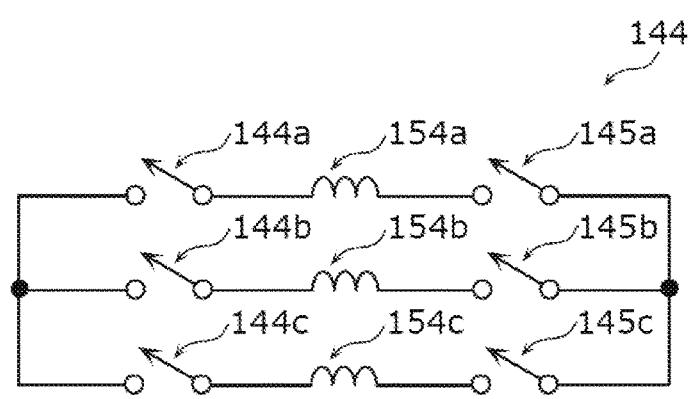
FIG. 12E is a diagram illustrating another example of a variable-impedance element of a matching network illustrated in FIG. 11.

The variable-impedance element 144 illustrated in FIG. 12E includes another example of a third circuit. The variable-impedance element 144 is defined by a plurality of second inductors 154a to 154c that are connected in parallel, and switches that are connected in series to at least one of the plurality of second inductors 154a to 154c (in this case, switches 144a and 145a, 144b and 145b, and 144c and 145c that are respectively connected in series to the second inductors 154a to 154c). The impedance of the variable-impedance element 144 is changed by the switches 144a and 145a, 144b and 145b, and 144c and 145c of which on and off are respectively controlled by an externally provided control circuit (not illustrated).

Figure 12F:
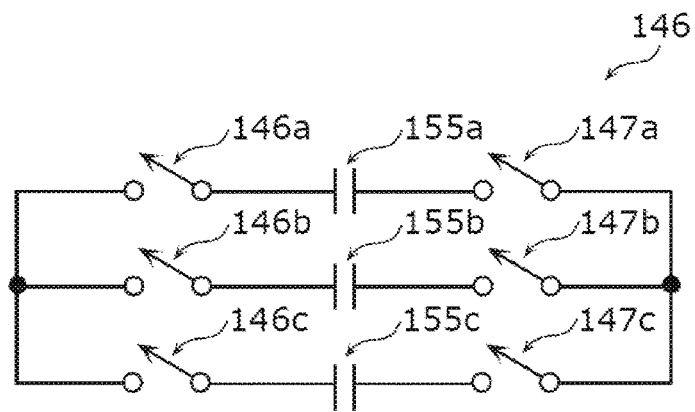
FIG. 12F is a diagram illustrating another example of a variable-impedance element of a matching network illustrated in FIG. 11.

The variable-impedance element 146 illustrated in FIG. 12F includes another example of a fourth circuit. The variable-impedance element 146 is defined by a plurality of second capacitors 155a to 155c that are connected in parallel, and switches that are connected in series to at least one of the plurality of second capacitors 155a to 155c (in this case, switches 146a and 147a, 146b and 147b, and 146c and 147c that are respectively connected in series to the second capacitors 155a to 155c). The impedance of the variable-impedance element 146 is changed by the switches 146a and 147a, 146b and 147b, and 146c and 147c, which are on and off controlled by an externally provided control circuit (not illustrated).

The matching network 14a illustrated in FIG. 11 includes at least one of the variable-impedance element 140 illustrated in FIG. 12A, the variable-impedance element 141 illustrated in FIG. 12B, the variable-impedance element 142 illustrated in FIG. 12C, the variable-impedance element 143 illustrated in FIG. 12D, the variable-impedance element 144 illustrated in FIG. 12E, and the variable-impedance element 146 illustrated in FIG. 12F.

According to the amplification circuit 10c of the present preferred embodiment configured as described above, for example, in the first switching circuit 12, when the first output terminal 12i is connected to one of the input terminals 12a to 12g in which a signal to be processed is input and the second output terminal 12h enters the open state and also the second switching circuit 18 is switched on, the impedance of the matching network 14a is adjusted, in accordance with the frequency of the signal input to the amplifier 16a, so that the impedance on the input side of the amplifier 16 matches the output impedance of the signal source that has output the signal to the amplifier 16. Adjustment of the impedance is performed by an externally provided control circuit (not illustrated), for example.

As described above, according to the amplification circuit 10c of preferred embodiment 4, because the matching network 14a is the impedance-variable matching network, there is an effect that, in addition to the effect that the amplification circuit 10 in preferred embodiment 1 exhibits, the impedance on the input side of the amplifier 16 is properly matched in accordance with the frequency of the input signal, and frequency dependence is further improved.

An amplification circuit may preferably include both of the characteristics of preferred embodiment 3 and the characteristics of preferred embodiment 4, for example. The amplification circuit includes the amplifier 16a of variable gain of preferred embodiment 3 for the amplifier, and also includes the matching network 14a which is the impedance-variable matching network of preferred embodiment 4 for the matching network. With this configuration, in accordance with the gain of the amplifier 16a, the impedance of the matching network 14a is able to be adjusted so that the impedance is matched.

Preferred Embodiment 5

Next an amplification circuit of preferred embodiment 5 of the present invention will be described.

Figure 13:
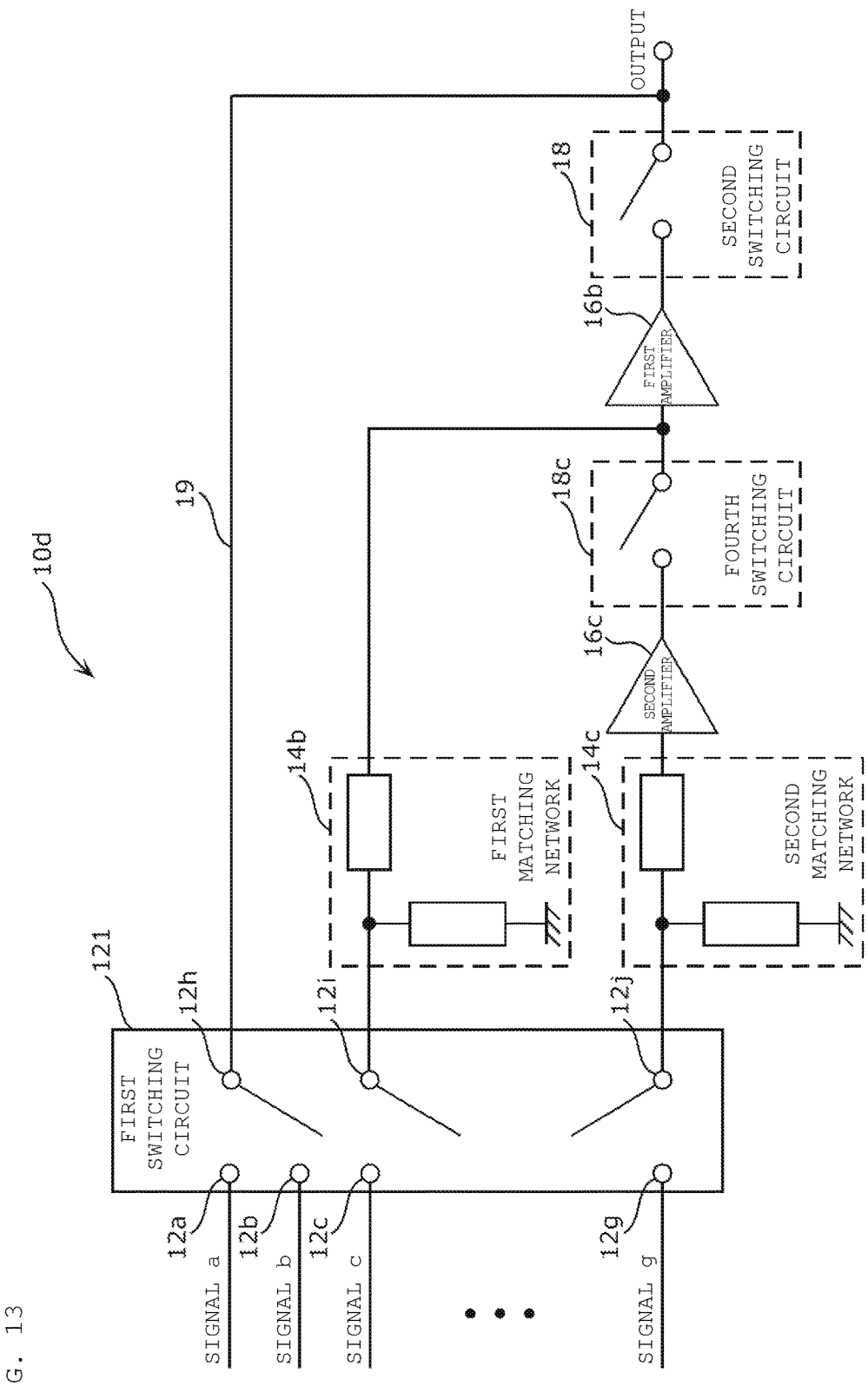
FIG. 13 is a circuit diagram of an amplification circuit of preferred embodiment 5 of the present invention.

FIG. 13 is a circuit diagram of an amplification circuit 10d of preferred embodiment 5 of the present invention. The amplification circuit 10d is a high-frequency module that selects and amplifies one signal from among signals of a plurality of frequency bands received by an antenna. The amplification circuit 10d includes a configuration in which, in the amplification circuit 10 of preferred embodiment 1, the first switching circuit 12 is replaced with a first switching circuit 121 that includes three output terminals, and a matching network, an amplifier, and a switching circuit are further included. Elements which are the same as those in preferred embodiment 1 are denoted by the same reference symbols, and primarily different points will be described.

The first switching circuit 121 has a configuration in which one output terminal is added to the first switching circuit 12 in preferred embodiment 1. The first switching circuit 121 is a circuit that includes one or more input terminals (here, input terminals 12a to 12g that correspond to signals a to g of a plurality of frequency bands), and a first output terminal 12i, a second output terminal 12h, and a third output terminal 12j and that puts the second output terminal 12h into an open state of being open with respect to each of the input terminals 12a to 12g while selectively connecting the first output terminal 12i or the third output terminal 12j to each of the input terminals 12a to 12g or selectively connects the second output terminal 12h to any one of the input terminals 12a to 12g while putting the first output terminal 12i and the third output terminal 12j into an open state of being open with respect to each of the input terminals 12a to 12g, and is, for example, a multiplexer defined by an nP3T (n-Pole 3 Throw) high-frequency switch.

The first matching network 14b, the first amplifier 16b, and the second switching circuit 18 respectively correspond to the matching network 14, the amplifier 16, and the second switching circuit 18 in preferred embodiment 1.

When the first switching circuit 121, the first matching network 14b, the first amplifier 16b, and the second switching circuit 18 are considered to correspond to the amplification circuit 10 of preferred embodiment 1, the amplification circuit 10d of the present preferred embodiment includes a configuration in which the second matching network 14c, the second amplifier 16c, and the fourth switching circuit 18c are added to the amplification circuit 10 of preferred embodiment 1.

The second matching network 14c is an input matching network that is connected to the third output terminal 12j. The second matching network 14c is provided in order to match the impedance on the input side of the second amplifier 16c, and includes a capacitor and an inductor, for example.

The second amplifier 16c is an amplifier connected to the output side of the second matching network 14c and is preferably, for example, a low-noise amplifier manufactured using an Si—Ge process.

The fourth switching circuit 18c is a switch that is connected between the output terminal of the second amplifier 16c and a connection point of the first matching network 14b and the input terminal of the first amplifier 16b, and that is switched on or off according to a control signal which is input from the outside. For example, the fourth switching circuit 18c is preferably a high-frequency switch of SPST. In the present preferred embodiment, the fourth switching circuit 18c is switched off when the first switching circuit 121 puts the third output terminal 12j into an open state.

The amplification circuit 10d of the present preferred embodiment configured as described above operates as follows.

When a signal to be processed which is input to one of the plurality of input terminals 12a to 12g of the first switching circuit 121 is a low-power signal (that is, when large amplification is performed to the input signal), the first switching circuit 121, the second switching circuit 18, and the fourth switching circuit 18c operate as follows in accordance with a control signal from an externally provided control circuit (not illustrated). That is, the first switching circuit 121 connects the third output terminal 12j to the one of the input terminals 12a to 12g to which the signal to be processed is input, and puts the first output terminal 12i and the second output terminal 12h into an open state. The second switching circuit 18 and the fourth switching circuit 18c are switched on. As a result, a signal to be processed input to one of the plurality of input terminals 12a to 12g of the first switching circuit 121 passes through the second matching network 14c isolated from the bypass path 19. The signal is input to the second amplifier 16c, is amplified by the second amplifier 16c, passes through the fourth switching circuit 18c, is input to the first amplifier 16b, is amplified by the first amplifier 16b, and is thereafter output via the second switching circuit 18.

On the other hand, when a signal to be processed which is input to one of the plurality of input terminals 12a to 12g of the first switching circuit 121 is a medium-power signal (that is, when the input signal is to be amplified to a medium level), the first switching circuit 121, the second switching circuit 18, and the fourth switching circuit 18c operate as follows in accordance with a control signal from an externally provided control circuit (not illustrated). That is, the first switching circuit 121 connects the first output terminal 12i to the one of the input terminals 12a to 12g to which the signal to be processed is input, and puts the second output terminal 12h and the third output terminal 12j into an open state. The second switching circuit 18 is switched on, and the fourth switching circuit 18c is switched off. As a result, a signal to be processed input to one of the plurality of input terminals 12a to 12g of the first switching circuit 121 passes through the first matching network 14b isolated from the bypass path 19. The signal is input to the first amplifier 16b, is amplified by the first amplifier 16b, and is thereafter output via the second switching circuit 18.

Further, when a signal to be processed which is input to one of the plurality of input terminals 12a to 12g of the first switching circuit 121 is a high-power signal (that is, when the input signal is made to pass along the bypass path 19 without being amplified), the first switching circuit 121, the second switching circuit 18, and the fourth switching circuit 18c operate as follows in accordance with a control signal from an externally provided control circuit (not illustrated). That is, the first switching circuit 121 puts the first output terminal 12i and the third output terminal 12j into an open state and connects the second output terminal 12h to the one of the input terminals 12a to 12g to which the signal to be processed is input. The second switching circuit 18 is switched off. The fourth switching circuit 18c may be on or off. As a result, the signal to be processed input to one of the plurality of input terminals 12a to 12g of the first switching circuit 121 is output via the second output terminal 12h and the bypass path 19 which are isolated from the first matching network 14b, the first amplifier 16b, the second matching network 14c, and the second amplifier 16c.

As described above, in the amplification circuit 10d of the present preferred embodiment, the two amplifiers (the first amplifier 16b and the second amplifier 16c) connected in series are provided. The amplification circuit 10d selectively operates either to perform large amplification of the input signal by using the two amplifiers or to perform ordinary amplification by using only one of the two amplifiers. As a result, by the amplification circuit 10d of the present preferred embodiment, there is an effect that, in addition to the effect exhibited by the amplification circuit 10 of preferred embodiment 1, the input signal is able to be properly amplified in accordance with the size of the input signal.

At least one of the two amplifiers (the first amplifier 16b and the second amplifier 16c) of the amplification circuit 10d may preferably be a variable-gain amplifier.

Figure 14:
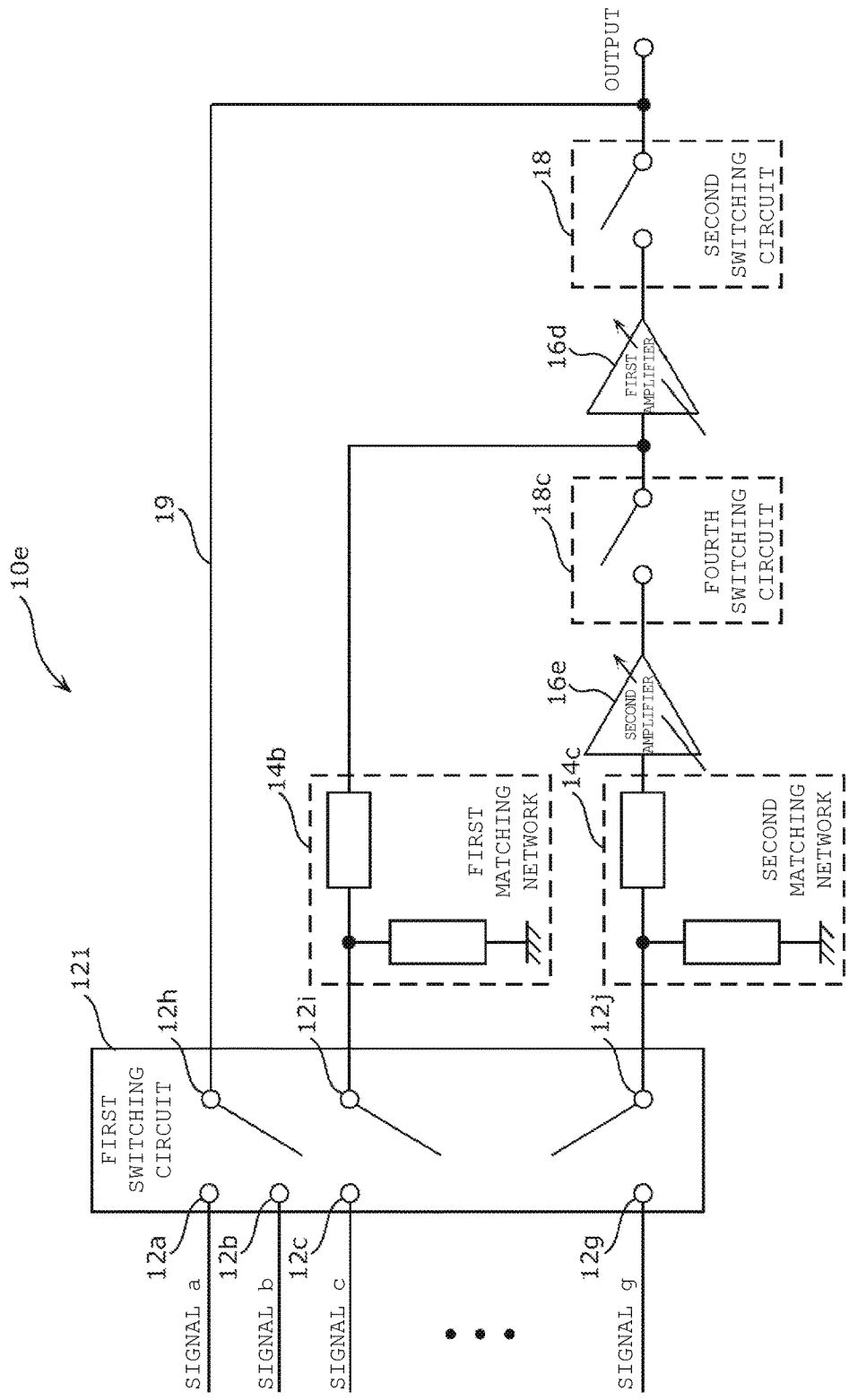
FIG. 14 is a circuit diagram of an amplification circuit according to a modification of preferred embodiment 5 of the present invention.

FIG. 14 is a circuit diagram of an amplification circuit 10e of a modification of preferred embodiment 5. The amplification circuit 10e includes a configuration in which, in the amplification circuit 10d of preferred embodiment 5, the first amplifier 16b and the second amplifier 16c are respectively replaced with the first amplifier 16d and the second amplifier 16e which are variable-gain amplifiers. The gains of the first amplifier 16d and the second amplifier 16e are adjusted in accordance with the size of the input signal. The adjustment of the gain is performed by an externally provided control circuit (not illustrated), for example.

With this configuration, as compared with preferred embodiment 5, the input signal is properly amplified over a larger range in accordance with the size of the input signal.

Preferred Embodiment 6

Next an amplification circuit of preferred embodiment 6 of the present invention will be described.

Figure 15:
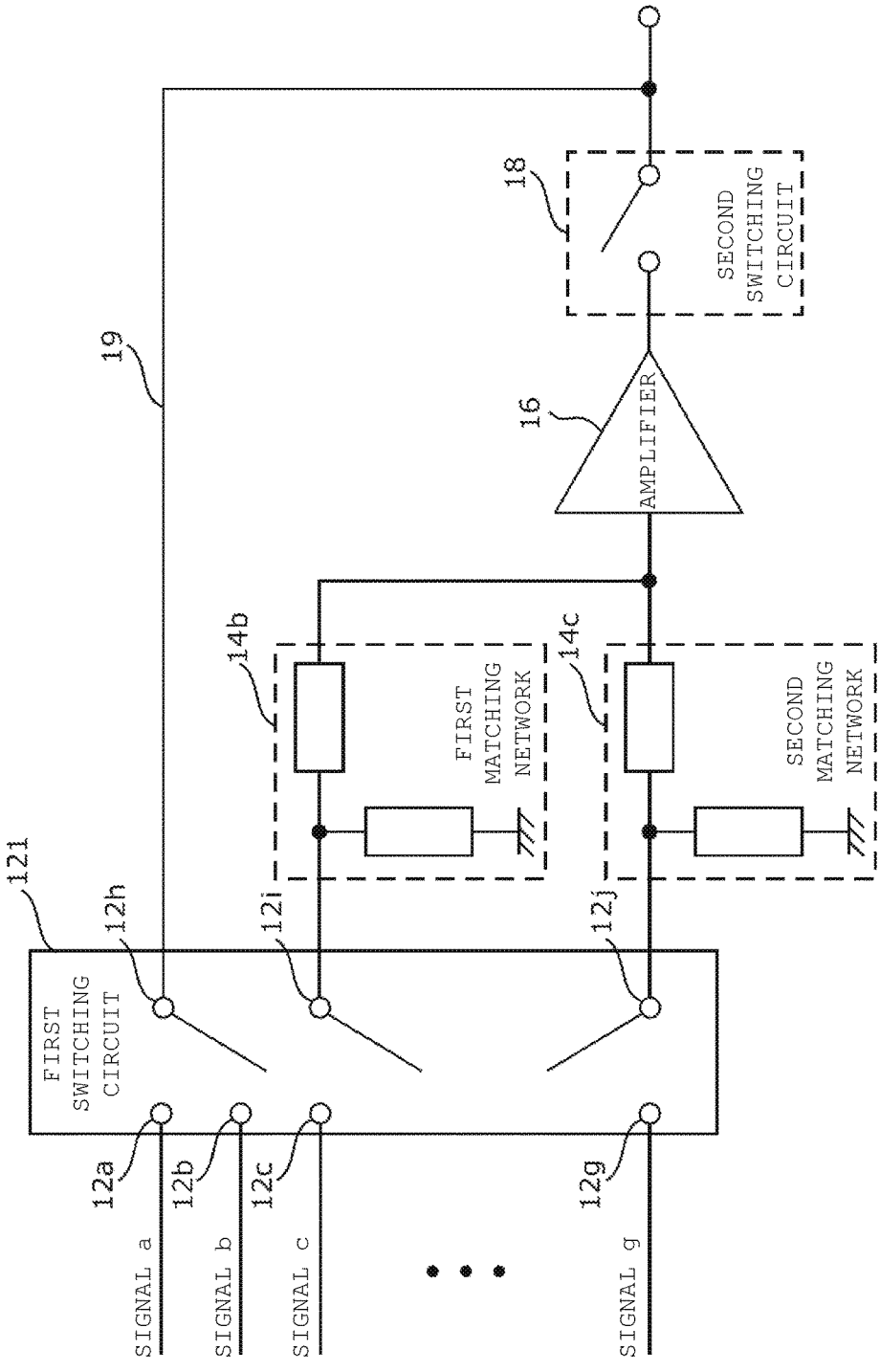
FIG. 15 is a circuit diagram of an amplification circuit of preferred embodiment 6 of the present invention.

FIG. 15 is a circuit diagram of an amplification circuit 10f of preferred embodiment 6 of the present invention. The amplification circuit 10f is a high-frequency module that selects and amplifies one signal from among signals of a plurality of frequency bands received by an antenna. The amplification circuit 10f includes a configuration in which, in the amplification circuit 10 of preferred embodiment 1, the first switching circuit 12 is replaced with a first switching circuit 121 that includes three output terminals and a second matching network 14c that is added. Configuration elements which are the same or substantially the same as those in preferred embodiment 1 are denoted by the same reference symbols, and primarily different points will be described.

The first switching circuit 121 is the same or substantially the same as the first switching circuit 121 in preferred embodiment 5.

The first matching network 14b and the second matching network 14c are the same or substantially the same as the first matching network 14b and the second matching network 14c, respectively, of preferred embodiment 5. The first matching network 14b and the second matching network 14c are connected in parallel to each other. The first matching network 14b is connected between the first output terminal 12i of the first switching circuit 121 and the input terminal of the amplifier 16. The second matching network 14c is connected between the third output terminal 12j of the first switching circuit 121 and the input terminal of the amplifier 16. That is, the output terminal of the first matching network 14b and the output terminal of the second matching network 14c are connected to each other, and are connected to the input terminal of the amplifier 16. The first matching network 14b and the second matching network 14c are provided to match the impedance on the input side of the amplifier 16, and a matching network that matches the input signal is selected.

When the first switching circuit 121, the first matching network 14b, the amplifier 16, and the second switching circuit 18 are considered to correspond to the amplification circuit 10 of preferred embodiment 1, the amplification circuit 10f of the present preferred embodiment includes a configuration in which the second matching network 14c is added to the amplification circuit 10 of preferred embodiment 1.

The amplification circuit 10f of the present preferred embodiment configured as described above operates as follows.

When a signal to be processed which is input to one of the plurality of input terminals 12a to 12g of the first switching circuit 121 is a low-power signal (that is, when the input signal is to be amplified), the first switching circuit 121 and the second switching circuit 18 operate as follows in accordance with a control signal from an externally provided control circuit (not illustrated). That is, the first switching circuit 121 connects at least one of the first output terminal 12*i* and the third output terminal 12*j* to the one of the input terminals 12*a* to 12*g* to which the signal to be processed is input, and puts the second output terminal 12*h* into an open state. The second switching circuit 18 is switched on. As a result, a signal to be processed input to one of the plurality of input terminals 12*a* to 12*g* of the first switching circuit 121 passes through at least one of the first matching network 14*b* and the second matching network 14*c* which are isolated from the bypass path 19. The signal is input to the amplifier 16, is amplified by the amplifier 16, and is thereafter output via the second switching circuit 18.

On the other hand, when a signal to be processed which is input to one of the plurality of input terminals 12*a* to 12*g* of the first switching circuit 121 is a high-power signal (that is, when the input signal is made to pass along the bypass path 19 without being amplified), the first switching circuit 121 and the second switching circuit 18 operate as follows in accordance with a control signal from an externally provided control circuit (not illustrated). That is, the first switching circuit 121 puts the first output terminal 12*i* and the third output terminal 12*j* into an open state and connects the second output terminal 12*h* to the one of the input terminals 12*a* to 12*g* to which the signal to be processed is input. The second switching circuit 18 is switched off. As a result, the signal to be processed that has been input to one of the plurality of input terminals 12*a* to 12*g* of the first switching circuit 121 is output via the second output terminal 12*h* and the bypass path 19 which are isolated from the first matching network 14*b*, the second matching network 14*c*, and the amplifier 16.

The control circuit (not illustrated), in the case of amplifying the input signal, connects at least one of the first output terminal 12*i* and the third output terminal 12*j* to one of the input terminals 12*a* to 12*g*. With this arrangement, the control circuit makes the input signal pass through at least one of the first matching network 14*b* and the second matching network 14*c*. Specifically, the control circuit selects one of the first matching network 14*b* and the second matching network 14*c* that are determined in advance depending on the frequency of the input signal.

As described above, according to the amplification circuit 10*f* of preferred embodiment 6, because the circuit including the first matching network 14*b* and the second matching network 14*c* added together defines and functions as one impedance-variable matching network, there is an effect that, in addition to the effect exhibited by the amplification circuit 10 in preferred embodiment 1, the impedance on the input side of the amplifier 16 is properly matched in accordance with the frequency and other characteristic of the input signal and frequency dependence is further improved.

Preferred Embodiment 7

Next an amplification circuit of preferred embodiment 7 of the present invention will be described.

Figure 16:
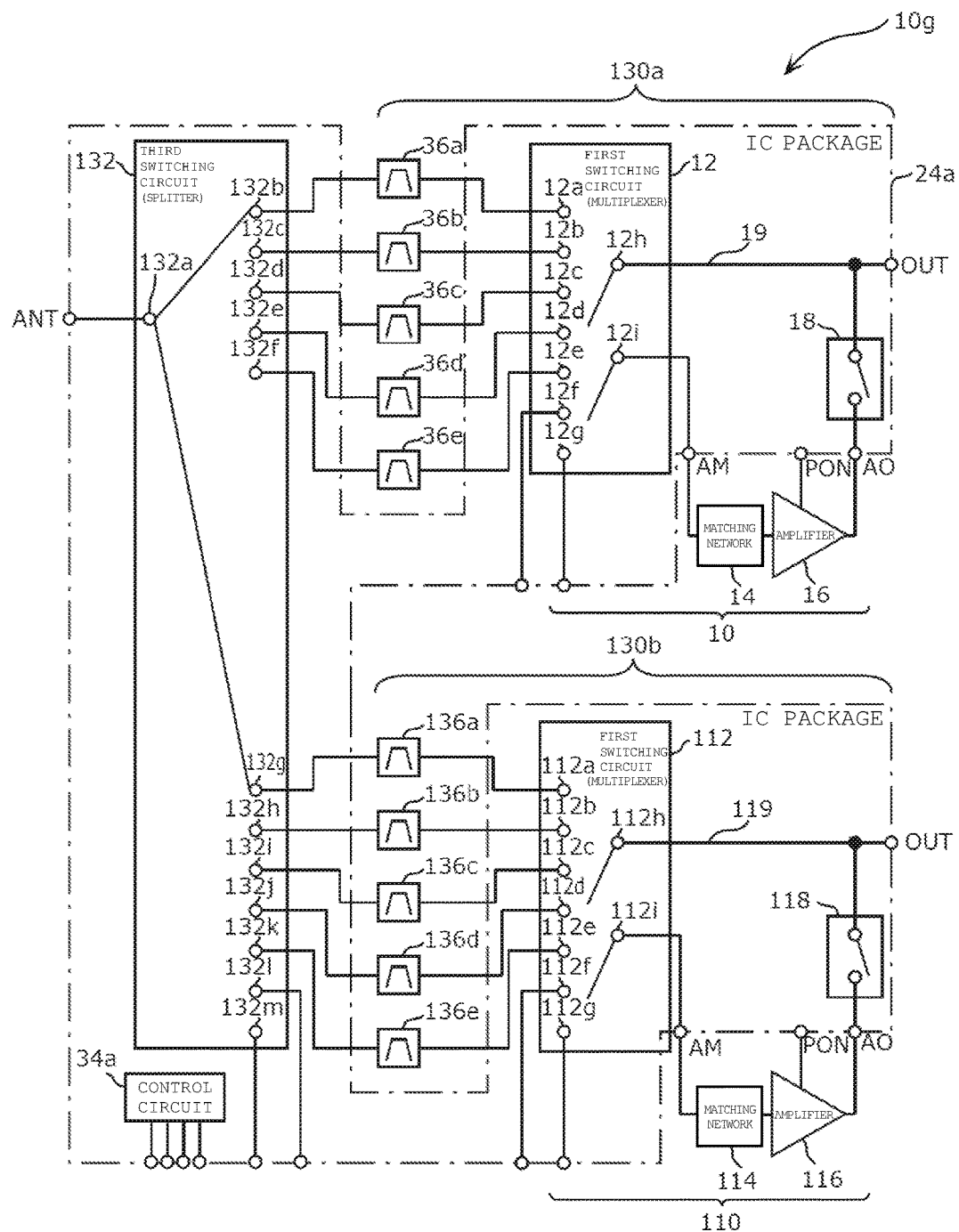
FIG. 16 is a circuit diagram of an amplification circuit of preferred embodiment 7 of the present invention.

FIG. 16 is a circuit diagram of an amplification circuit 10*g* of preferred embodiment 7 of the present invention. The amplification circuit 10*g* is a high-frequency module that selects and amplifies at least one signal from among signals of a plurality of frequency bands received by an antenna, and includes a third switching circuit 132, a control circuit 34*a*, a first amplifying unit 130*a*, a second amplifying unit 130*b*. This configuration corresponds to a configuration in which, in the amplification circuit 30 of preferred embodiment 2, one more set of the filters 36*a* to 36*e* and the amplification circuit 10 is added (two sets are provided in total, for example).

The third switching circuit 132 includes an input terminal 132*a*, a first group of plurality of output terminals 132*b* to 132*f*, a second group of plurality of output terminals 132*g* to 132*k*, and a third group of output terminals 132*l* and 132*m* that are connected to an antenna (not illustrated). The third switching circuit 132 is a circuit that performs at least one of selectively putting the input terminal 132*a* into a state of being connected to at least one of the first group of plurality of output terminals 132*b* to 132*f* and selectively putting the input terminal 132*a* into a state of being connected to at least one of the second group of plurality of output terminals 132*g* to 132*k*, according to a control signal input from the control circuit 34*a*. The third switching circuit 132 is a splitter preferably defined by two high-frequency switches of SPnT in which the input terminals are connected to each other, for example. The output terminals 132*l* and 132*m* correspond to the output terminals 132*g* and 132*h* of preferred embodiment 2.

The first amplifying unit 130*a* is an amplifying circuit for a first communication band (for example, Band1 as a 2 GHz band)) connected to the first group of plurality of output terminals 132*b* to 132*f* of the third switching circuit 132. The first amplifying unit 130*a* includes the filters 36*a* to 36*e* and the amplification circuit 10 of preferred embodiment 1. The filters 36*a* to 36*e* are filters for the first communication band (the first communication band which is further divided into detailed band zones) connected one-to-one to the first group of plurality of output terminals 132*b* to 132*f* corresponding to the third switching circuit 132. The filters 36*a* to 36*e* are the same or substantially the same as the filters 36*a* to 36*e* of preferred embodiment 2. The first switching circuit 12, the matching network 14, the amplifier 16, and the second switching circuit 18 are the same or substantially the same as the amplification circuit 10 of preferred embodiment 1.

The second amplifying unit 130*b* is an amplification circuit that includes the same or substantially the same configuration as that of the first amplifying unit 130*a*. The second amplifying unit 130*b* amplifies an input signal of a second communication band (for example, an 800 MHz band (for example, Band19 as the 800 MHz band)) different from the communication band of the first amplifying unit 130*a*. That is, the second amplifying unit 130*b* is an amplification circuit for the second communication band connected to the second group of plurality of output terminals 132*g* to 132*k* of the third switching circuit 132. The second amplifying unit 130*b* includes the filters 136*a* to 136*e* of the second frequency band and an amplification circuit 110 having the same or substantially the same configuration as that of the amplification circuit 10 of preferred embodiment 1. The filters 136*a* to 136*e* are filters for the second communication band (the second communication band which is further divided into detailed band zones) connected one-to-one to the second group of plurality of output terminals 132*g* to 132*k* corresponding to the third switching circuit 132. The filters 136*a* to 136*e* pass signals of the communication band different from the filters 36*a* to 36*e* of the first amplifying unit 130*a*. The first switching circuit 112, the matching network 114, the amplifier 116, and the second switching circuit 118 are the same or substantially the same as the first switching circuit 12, the matching network 14, the amplifier 16, and the second switching circuit 18 that are included in the amplification circuit 10 of preferred embodiment 1.

The control circuit 34*a* outputs control signals to the first switching circuits 12 and 112 and the third switching circuit 132 and to the second switching circuits 18 and 118. With this arrangement, the control circuit 34a switches the first switching circuits 12 and 112 and the third switching circuit 132 in a coupled manner in accordance with the frequency band of an input signal to be processed, and switches the second switching circuits 18 and 118 on or off in accordance with the magnitude of the power of the input signal (that is, in accordance with whether the input signal is to be amplified).

In the amplification circuit 10g, as illustrated, the first switching circuits 12 and 112, the third switching circuit 132, the second switching circuits 18 and 118, and the control circuit 34a are preferably defined by one IC package 24a. That is, the first switching circuits 12 and 112, the third switching circuit 132, the second switching circuits 18 and 118 and the control circuit 34a are provided on a single semiconductor substrate. The IC package 24a is preferably manufactured by the SOI process, for example, in a similar manner to that of the IC package 24 of preferred embodiment 2. As main terminals, the IC package 24a includes an ANT terminal connected to the input terminal 132a of the third switching circuit 132; an AM terminal for the first amplifying unit 130a connected to the first output terminal 12i of the first switching circuit 12; an AM terminal for the second amplifying unit 130b connected to the first output terminal 112i of the first switching circuit 112; a PON terminal for the first amplifying unit 130a that supplies power to the amplifier 16; a PON terminal for the second amplifying unit 130b that supplies power to the amplifier 116; an AO terminal for the first amplifying unit 130a connected to the input terminal of the second switching circuit 18; an AO terminal for the second amplifying unit 130b connected to the input terminal of the second switching circuit 118; an OUT terminal for the first amplifying unit 130a connected to the second output terminal 12h of the first switching circuit 12 and the output terminal of the second switching circuit 18; and an OUT terminal for the second amplifying unit 130b connected to the second output terminal 112h of the first switching circuit 112 and the output terminal of the second switching circuit 118.

The amplification circuit 10g of the present preferred embodiment as described above operates as follows.

The amplification circuit 10g performs only operation (1), only operation (2), or simultaneously performs both operation (1) and operation (2), depending on whether signals of the first communication band and the second communication band are contained in the input signal, as described in the following operations (1) and (2). The process of simultaneously performing the operation (1) and the operation (2) is a reception process corresponding to the carrier aggregation.

(1) When a signal of the first communication band is contained in the input signal, the control circuit 34a performs the following operation.

Upon determining that an input signal to be processed is a signal of a first frequency band (a frequency band handled by the filter 36a) in the first communication band and that the input signal is a low-power signal (that is, the input signal is to be amplified), the control circuit 34a controls the third switching circuit 132 to connect the input terminal 132a to the output terminal 132b, controls the first switching circuit 12 to connect the first output terminal 12i to the input terminal 12a and put the second output terminal 12h into an open state, and switches the second switching circuit 18 on. As a result, a low-power input signal of the first communication band input to the ANT terminal passes through the third switching circuit 132 from the input terminal 132a to the output terminal 132b. The signal passes through the filter 36a, is input to the input terminal 12a of the first switching circuit 12, passes through the AM terminal from the first output terminal 12i of the first switching circuit 12, and passes through the matching network 14. The signal is input to the amplifier 16, is amplified by the amplifier 16, passes through the AO terminal, passes through the second switching circuit 18, and is output from the OUT terminal.

On the other hand, upon determining that an input signal to be processed is a signal of the first frequency band (a frequency band handled by the filter 36a) in the first communication band and that the input signal is a high-power signal (that is, the input signal is not to be amplified and is to be made to pass along the bypass path 19), the control circuit 34a controls the third switching circuit 132 to connect the input terminal 132a to the output terminal 132b, controls the first switching circuit 12 to put the first output terminal 12i into an open state and to connect the second output terminal 12h to the input terminal 12a, and switches the second switching circuit 18 off. As a result, a high-power input signal in the first communication band input to the ANT terminal passes through the third switching circuit 132 from the input terminal 132a to the output terminal 132b. The signal passes through the first switching circuit 12 from the input terminal 12a to the second output terminal 12h, and is thereafter output from the OUT terminal along the bypass path 19 isolated from the matching network 14 and the amplifier 16.

When the input signal to be processed is a signal of another frequency band in the first communication band (for example, the frequency handled by the filter 36b), the control circuit 34a controls the third switching circuit 132 to connect the input terminal 132a to the corresponding output terminal (for example, the output terminal 132c), controls the first switching circuit 12 to connect either the first output terminal 12i or the second output terminal 12h to the corresponding input terminal (for example, the input terminal 12b) and to put the other of the first output terminal 12i and the second output terminal 12h into an open state in accordance with the magnitude of the power of the input signal. As a result, the signal in the first communication band input to the ANT terminal passes through the third switching circuit 132, and is then input to the first amplifying unit 130a. The signal is amplified by the amplifier 16 in accordance with the magnitude of the power of the input signal and is output, or is output along the bypass path 19.

When a signal of the second communication band is contained in the input signal, the control circuit 34a performs the following operation in parallel with the operation (1).

Upon determining that an input signal to be processed is a signal of a first frequency band (a frequency band handled by the filter 136a) in the second communication band and that the input signal is a low-power signal (that is, the input signal is to be amplified), the control circuit 34a controls the third switching circuit 132 to connect the input terminal 132a to the output terminal 132g, controls the first switching circuit 112 to connect the first output terminal 112i to the input terminal 112a and put the second output terminal 112h into an open state, and switches the second switching circuit 118 on. As a result, a low-power input signal of the second communication band input to the ANT terminal passes through the third switching circuit 132 from the input terminal 132a to the output terminal 132g. The signal passes through the filter 136a, is input to the input terminal 112a of the first switching circuit 112, and passes through the AM terminal from the first output terminal 112i of the first switching circuit 112. The signal passes through the matching network 114, is input to the amplifier 116, and is amplified by the amplifier 116. The signal passes through the AO terminal, passes through the second switching circuit 118, and is output from the OUT terminal.

On the other hand, upon determining that an input signal to be processed is a signal of the first frequency band (frequency band handled by the filter 136a) in the second communication band and that the input signal is a high-power signal (that is, the input signal is not to be amplified and is to be made to pass along the bypass path 119), the control circuit 34a controls the third switching circuit 132 to connect the input terminal 132a to the output terminal 132g, controls the first switching circuit 112 to put the first output terminal 112i into an open state and to connect the second output terminal 112h to the input terminal 112a and switches the second switching circuit 118 off. As a result, a high-power input signal of the second communication band input to the ANT terminal passes through the third switching circuit 132 from the input terminal 132a to the output terminal 132g. The signal passes through the first switching circuit 112 from the input terminal 112a to the second output terminal 112h, and is thereafter output from the OUT terminal along the bypass path 119 isolated from the matching network 114 and the amplifier 116.

When the input signal to be processed is a signal of another frequency band of the second communication band (for example, the frequency band handled by the filter 136b), the control circuit 34a controls the third switching circuit 132 to connect the input terminal 132a to the corresponding output terminal (for example, the output terminal 132h), controls the first switching circuit 112 to connect either the first output terminal 112i or the second output terminal 112h to the corresponding input terminal (for example, the input terminal 112b) and to put the other of the first output terminal 112i and the second output terminal 112h into an open state in accordance with the magnitude of the power of the input signal. As a result, a signal of the second communication band input to the ANT terminal passes through the third switching circuit 132, and is thereafter input to the second amplifying unit 130b. The signal is amplified by the amplifier 116 in accordance with the magnitude of the power of the input signal and is output, or is output along the bypass path 119.

As described above, the amplification circuit 10g of the present preferred embodiment includes the first amplifying unit 130a corresponding to the first communication band and the second amplifying unit 130b corresponding to the second communication band. The amplification circuit 10g is able to simultaneously amplify the input signals of the first communication band and the second communication band by using a proper filter. Therefore, a reception process corresponding to the carrier aggregation becomes possible.

The third switching circuit 132 of the amplification circuit 10g in the present preferred embodiment is not limited to the circuit illustrated in FIG. 16, and may include a multiplexer.

Figure 17:
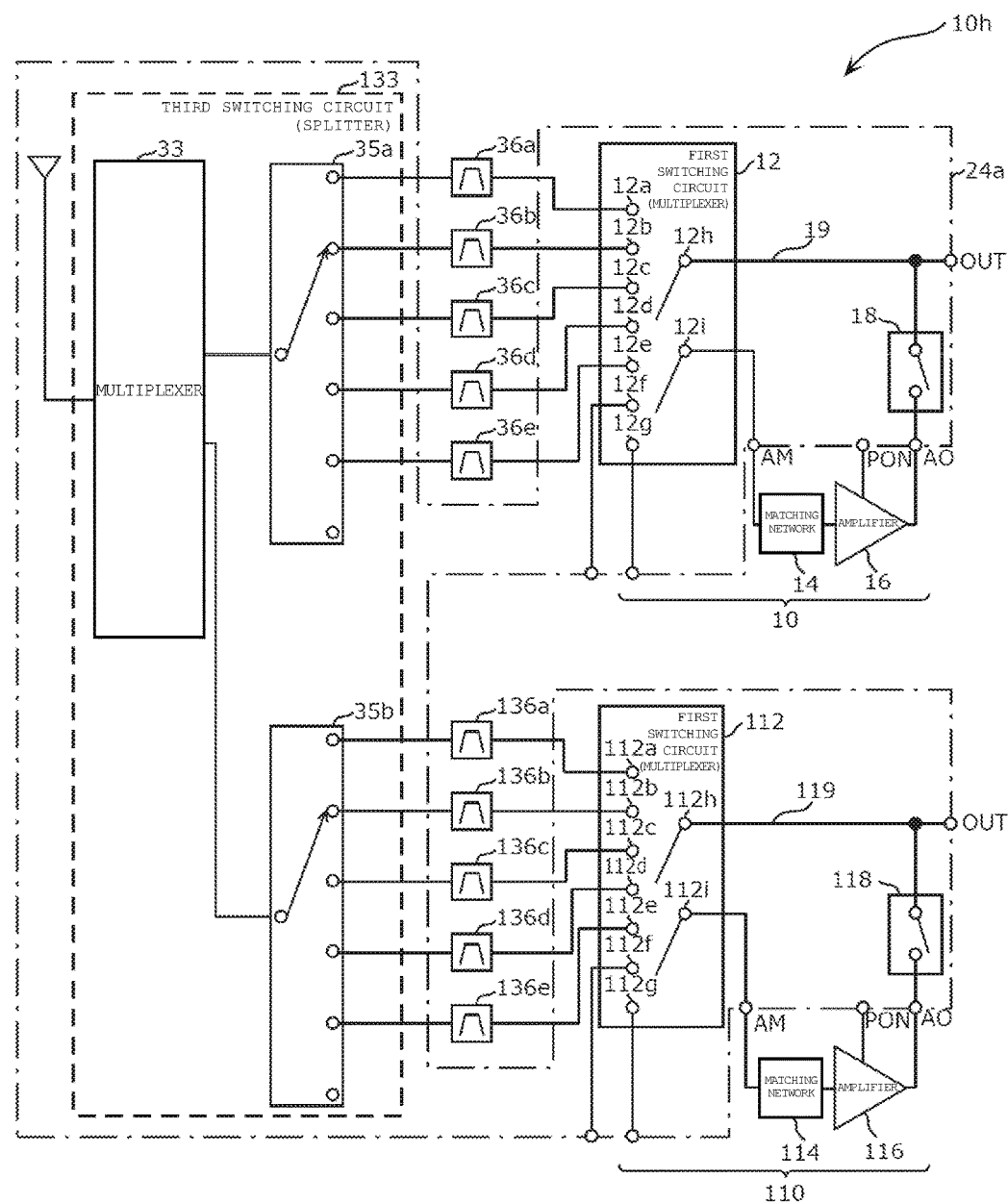
FIG. 17 is a circuit diagram of an amplification circuit according to a modification of preferred embodiment 7 of the present invention.

FIG. 17 is a circuit diagram of an amplification circuit 10h of a modification of preferred embodiment 7. The amplification circuit 10h has a configuration in which the third switching circuit 132 in the amplification circuit 10g of preferred embodiment 7 is replaced with a third switching circuit 133 including the multiplexer 33.

The third switching circuit 133 is preferably defined by the multiplexer 33 and four switches 35a to 35d as illustrated in FIG. 17.

The multiplexer 33 is an example of a multiplexer defined by at least two filters having different frequency bands (in this case, a multiplexer having two filters having different frequency bands). The multiplexer 33 splits the signal input to the input terminal connected to the antenna, into one of the two frequency bands, in accordance with the frequency of the signal, and outputs the split signal. One of the at least two filters of the multiplexer 33 is preferably a hybrid multiplexer, for example. Specifically, one of the at least two filters of the multiplexer 33 is preferably a hybrid filter defined by a combination of an elastic wave filter and a passive component. The filter has a wide pass band and a steep band edge characteristic. The elastic wave filter may preferably be a SAW (Surface Acoustic Wave) filter or a BAW (Bulk Acoustic Wave) filter, for example. The SAW filter includes a substrate and an IDT (Interdigital transducer) electrode. The substrate has piezoelectricity on at least the surface. For example, the substrate may preferably be defined by a stacked body of a piezoelectric thin film on the surface, a film of acoustic velocity different from that of the piezoelectric thin film, and a supporting substrate. The substrate may have piezoelectricity in the entire substrate. In this case, the substrate is a piezoelectric substrate including one piezoelectric layer.

At least one of the at least two filters of the multiplexer 33 may preferably be any one of a High Pass Filter (HPF), a Low Pass Filter (LPF), and a Band Pass Filter (BPF) defined by an LC filter and a notch filter.

The switch 35a is a switch that includes an input terminal connected to one of two output terminals of the multiplexer 33 and includes six output terminals connected to the input terminals of the filters 36a to 36e. For example, the switch 35a may preferably be a high-frequency switch of SP6T (Single Pole 6 Throw).

The switch 35b is a switch that includes an input terminal connected to the other of the two output terminals of the multiplexer 33 and includes six output terminals connected to the input terminals of the filters 136a to 136e. For example, the switch 35b may preferably be a high-frequency switch of SP6T (Single Pole 6 Throw).

The amplification circuit 10h that includes the third switching circuit 133 defined by the multiplexer 33 and the four switches 35a to 35d also operates in a similar manner to that of preferred embodiment 7. Accordingly, the amplification circuit 10h of the present modification also includes the first amplifying unit 130a corresponding to the first communication band and the second amplifying unit 130b corresponding to the second communication band. The amplification circuit 10h is able to simultaneously amplify the input signals of the first communication band and the second communication band by using a proper filter. Therefore, a reception process corresponding to the carrier aggregation becomes possible.

Mounting structures of the amplification circuits according to preferred embodiments 1 to 7 of the present invention will be described as preferred embodiments 8 to 10.

Preferred Embodiment 8

Figure 18A:
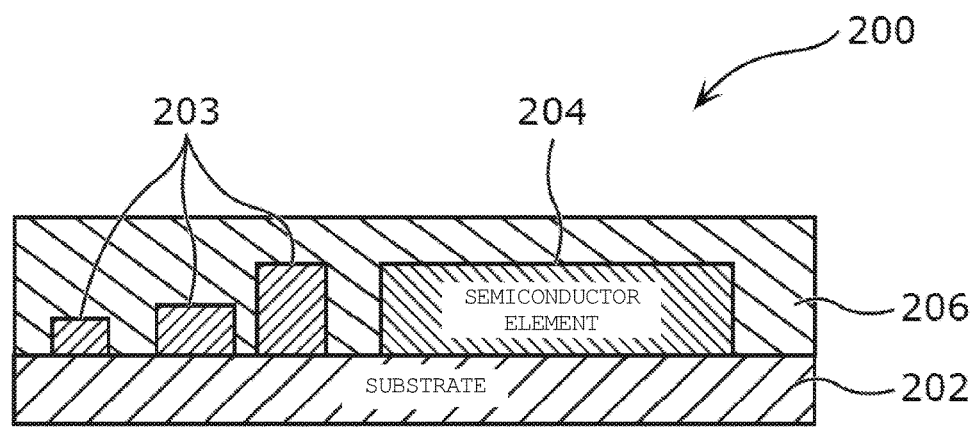
FIG. 18A is a sectional view illustrating a mounting structure of an amplification circuit according to preferred embodiment 8 of the present invention.

FIG. 18A is a sectional view illustrating a mounting structure of an amplification circuit 200 according to preferred embodiment 8 of the present invention. The amplification circuit 200 includes a substrate 202, passive components 203 and a semiconductor element 204 mounted on one surface of the substrate 202, and a resin 206 that molds the passive components 203 and the semiconductor element 204. On a bottom surface (that is a mounting surface) of the amplification circuit 200, electrodes that are electrically connected to the passive components 203 or the semiconductor element 204 or another component are provided, of which illustration is omitted.

The amplification circuit 200 is a circuit including at least two configuration elements packaged in the amplification circuit of any one of preferred embodiments 1 to 7. Specifically, the amplification circuit 200 is preferably a chip that includes at least two configuration elements out of a first switching circuit, a second switching circuit, a third switching circuit, a matching network, and an amplifier.

The substrate 202 is preferably a single-sided mounting circuit substrate to mount the elements and components, such as an LTCC (Low Temperature Co-fired Ceramics) substrate and a printed substrate, for example.

The passive component 203 is a passive component out of components defining the at least two configuration elements, such as an inductor, a capacitor, and a filter, for example.

Figure 18B:
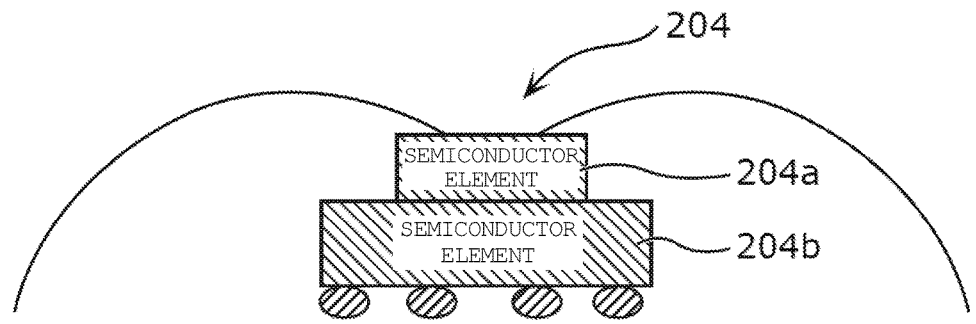
FIG. 18B is a sectional view illustrating a mounting example of a semiconductor element.

The semiconductor element 204 is an active component out of components that define the at least two configuration elements, such as a high-frequency switch, a transistor, a diode, an operational amplifier, and an IC, for example. When a component that defines the at least two configuration elements includes a plurality of semiconductor elements, a plurality of semiconductor elements 204a and 204b may be mounted on the substrate 202 by being stacked, as illustrated in the sectional view that illustrates a mounting example of the semiconductor elements in FIG. 18B. In the mounting example illustrated in FIG. 18B, the semiconductor element 204a stacked above the semiconductor element 204b is connected to the electrodes on the substrate 202 by wire bonding.

The resin 206 is preferably an encapsulation resin, such as an epoxy resin, that molds the passive components 203 and the semiconductor element 204 that are mounted on the substrate 202, in order to protect the passive components 203 and the semiconductor element 204 from the environment, such as light, heat, and moisture. The external surface of the resin 206 may be covered with a shielding material.

As described, in the amplification circuit 200 of the present preferred embodiment, because a plurality of configuration elements are mounted on one substrate and are incorporated as an IC package, a mounting area of elements and components is able to be reduced and cost reduction is able to be achieved.

Preferred Embodiment 9

Figure 19:
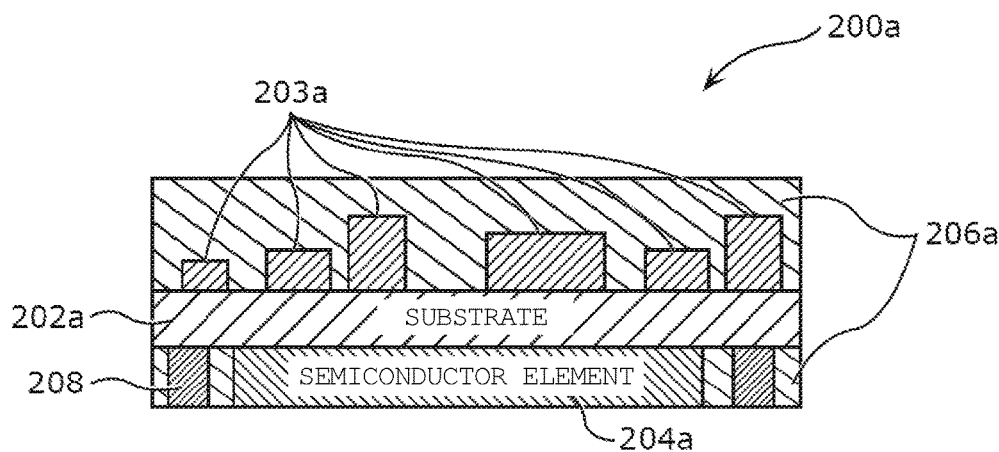
FIG. 19 is a sectional view illustrating a mounting structure of an amplification circuit according to preferred embodiment 9 of the present invention.

FIG. 19 is a sectional view illustrating a mounting structure of an amplification circuit 200a according to preferred embodiment 9 of the present invention. The amplification circuit 200a includes a substrate 202a, a passive component 203a mounted on a first surface of the substrate 202a, a semiconductor element 204a mounted on a second surface opposite to the first surface of the substrate 202a, and resins 206a that mold the passive component 203a and the semiconductor element 204a. Wired portions on the substrate 202a are connected, by a via 208, to electrodes (not illustrated) provided on a bottom surface (that is a mounting surface) of the amplification circuit 200a.

The amplification circuit 200a is preferably a circuit in which at least two configuration elements of the amplification circuit in one of preferred embodiments 1 to 7 are packaged. Specifically, the amplification circuit 200a is preferably a chip that includes at least two configuration elements out of a first switching circuit, a second switching circuit, a third switching circuit, a matching network, and an amplifier.

The substrate 202a, the passive components 203a, the semiconductor element 204a, and the resins 206a of the amplification circuit 200a are the same or substantially the same as the substrate 202, the passive components 203, the semiconductor element 204, and the resin 206 in preferred embodiment 8. The present preferred embodiment is different from preferred embodiment 8 in that components are mounted on both surfaces while the components are mounted on one surface in preferred embodiment 8.

That is, in the present preferred embodiment, preferably at least one of the at least two configuration elements is mounted on the first surface (for example, the surface) of the substrate 202a, and the other one of the at least two configuration elements is mounted on the second surface (for example, the back surface) of the substrate 202a. Specifically, the at least two configuration elements include at least one passive component 203a and at least one semiconductor element 204a. At least one passive component 203a is mounted on the first surface of the substrate 202a, and at least one semiconductor element 204a is mounted on the second surface of the substrate 202a.

As described above, in the amplification circuit 200a of the present preferred embodiment, a plurality of configuration elements are mounted on both surfaces of one substrate and are incorporated as an IC package. Therefore, mounting of the elements and components is able to be more highly integrated than in preferred embodiment 8.

Preferred Embodiment 10

Figure 20A:
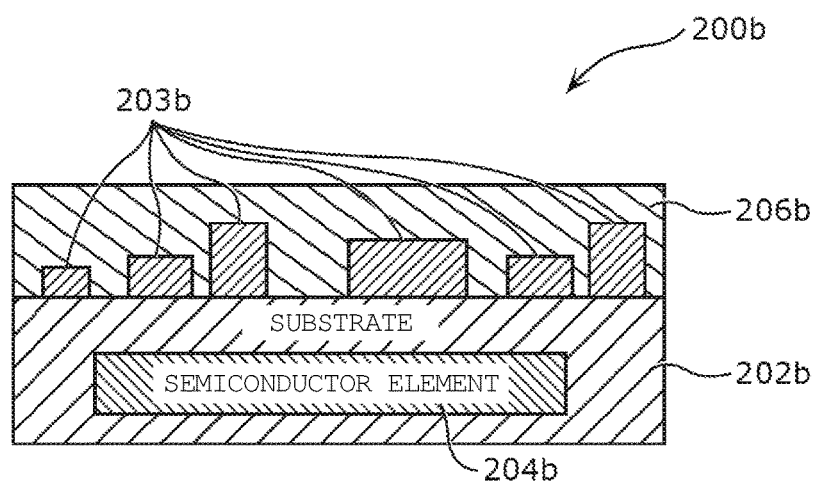
FIG. 20A is a sectional view illustrating a mounting structure of an amplification circuit according to preferred embodiment 10 of the present invention.

FIG. 20A is a sectional view illustrating a mounting structure of an amplification circuit 200b according to preferred embodiment 10 of the present invention. The amplification circuit 200b includes a substrate 202b, passive components 203b mounted on the substrate 202b, a semiconductor element 204b mounted by being incorporated in the substrate 202b, and a resin 206b that molds the passive components 203b. On a bottom surface (that is a mounting surface) of the amplification circuit 200b, electrodes that are electrically connected to the inside configuration elements are provided, of which illustration is omitted.

The amplification circuit 200b is a circuit in which at least two configuration elements of the amplification circuit in one of preferred embodiments 1 to 7 are packaged. Specifically, the amplification circuit 200b is preferably a chip that includes at least two configuration elements out of a first switching circuit, a second switching circuit, a third switching circuit, a matching network, and an amplifier.

The substrate 202b, the passive components 203b, the semiconductor element 204b, and the resin 206b of the amplification circuit 200b are the same or substantially the same as the substrate 202, the passive component 203, the semiconductor element 204, and the resin 206 in preferred embodiment 8. The present preferred embodiment is different from preferred embodiment 8 in that components are mounted on the upper surface and the inside of the substrate while the components are mounted on one surface in preferred embodiment 8.

That is, in the present preferred embodiment, preferably at least one of the at least two configuration elements is mounted on the substrate 202b, and the other one of the at least two configuration elements is mounted by being incorporated in the substrate 202b. Specifically, the at least two configuration elements include at least one passive component 203b and at least one semiconductor element 204b. At least one passive component 203b is mounted on the substrate 202*b*, and at least one semiconductor element 204*b* is mounted by being incorporated in the substrate 202*b*.

The substrate 202*b* that incorporates such a component is achieved by incorporating the component in the printed substrate.

Figure 20B:
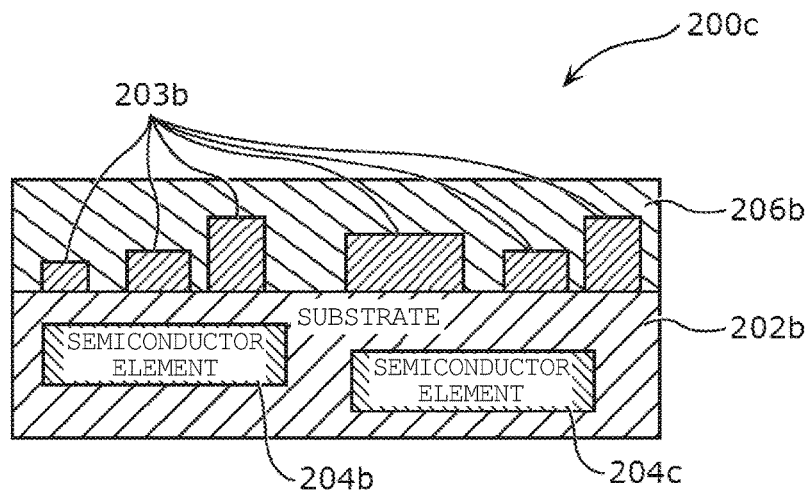
FIG. 20B is a sectional view illustrating a mounting structure of an amplification circuit according to a modification of preferred embodiment 10 of the present invention.

The number of components mounted by being incorporated in the substrate 202*b* is not limited to one and may be more. For example, as illustrated in the sectional view in FIG. 20B of the mounting structure of the amplification circuit 200*c* in the modification of preferred embodiment 10, two semiconductor elements 204*b* and 204*c* may preferably be mounted by being incorporated in the substrate 202*b*.

As described above, in the amplification circuits 200*b* and 200*c* of the present preferred embodiment, a plurality of configuration elements are preferably mounted not only on the surface of one substrate but also inside the substrate and are incorporated as an IC package. Therefore, mounting of the components is able to be more highly integrated than in preferred embodiments 8 and 9.

Amplification circuits of the present invention have been described based on preferred embodiments 1 to 10. However, the present invention is not limited to these preferred embodiments and modifications. Various modifications, perceived by a person skilled in the art, to the preferred embodiments and modifications made by combining some of the elements or features of the preferred embodiments or modifications are to be included in the scope of the present invention so long as the modifications and other preferred embodiments do not depart from the gist of the present invention.

For example, while the amplifier 16*a* in preferred embodiment 3 preferably is a variable-gain amplifier, the amplifiers in other preferred embodiments may also preferably be variable-gain amplifiers. Specifically, the amplifier 16 of preferred embodiment 4, the amplifier 16 of preferred embodiment 6, and the amplifiers 16 and 116 of preferred embodiment 7 may also preferably be variable-gain amplifiers. With this configuration, in the amplification circuits according to these preferred embodiments, there is also an effect that the input signal is able to be properly amplified in accordance with the size of the input signal.

While the matching network 14*a* of preferred embodiment preferably is an impedance-variable matching network, the matching networks in other preferred embodiments may also preferably be impedance-variable matching networks. Specifically, the first matching network 14*b* and the second matching network 14*c* of preferred embodiment 5, the first matching network 14*b* and the second matching network 14*c* of preferred embodiment 6, and the matching networks 14 and 114 of preferred embodiment 7 may also preferably be impedance-variable matching networks. With this configuration, in the amplification circuits in these preferred embodiments, there is an effect that impedance on the input side of the amplifier is properly matched according to the frequency of the input signal, and frequency dependence is further improved.

In preferred embodiments 5 and 6, two signal paths using two kinds of matching networks are preferably provided as signal paths for amplifying the input signal. However, the number of signal paths is not limited, and three or more signal paths using three or more kinds of matching networks may preferably be provided. With this configuration, there is an effect that impedance on the input side of the amplifier is more minutely matched according to the frequency of the input signal, and frequency dependence is further improved.

In the amplification circuits 10*g* and 10*h* of preferred embodiment 7, the two amplifying units preferably include the amplification circuit 10 of preferred embodiment 1. However, the amplification circuit is not limited, and any one of the amplification circuits in preferred embodiments 3 to 6 may be included. Further, the two amplifying units are not limited to having the same or substantially the same circuit configurations, and may have different circuit configurations. For example, the first amplifying unit 130*a* may have the amplification circuit 10 of preferred embodiment 1, and the second amplifying unit 130*b* may have the amplification circuit 10*b* of preferred embodiment 3. With this configuration, a reception process corresponding to various carrier aggregation using a plurality of communication bands is able to be performed.

The amplification circuits 10*g* and 10*h* of preferred embodiment 7 simultaneously amplify two communication bands. However, the amplification circuits 10*g* and 10*h* may preferably simultaneously amplify three or more communication bands. For example, by providing a third group of output terminals as the output terminals of the third switching circuits 132 and 133, and by adding a filter group and a third amplifying unit connected to the third group of output terminals, a reception process corresponding to the carrier aggregation using three communication bands is able to be performed.

In preferred embodiments 9 and 10, portions (a surface, the inside) of the substrate at which the passive components and the semiconductor element are mounted are separated. However, how to separate the elements and components to be mounted at separate portions of the substrate is not limited to this. For example, the portions of the substrate may preferably be separated based on elements or the circuit elements (elements of a first switching circuit, a second switching circuit, a third switching circuit, a matching network, and an amplifier). With this configuration, elements and components that exhibit the same or substantially the same function are able to be mounted at portions near the substrate, and mounting density is improved.

Various preferred embodiments of the present invention are able to be used as an amplifier that includes a bypass path, for example, as a high-frequency module selects whether to amplify or to pass therethrough any of signals of a plurality of frequency bands received by an antenna.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An amplification circuit comprising:
 a first switching circuit that includes a plurality of input terminals that correspond to signals of a plurality of frequency bands, a first output terminal and a second output terminal, and that puts the second output terminal into an open state of being open with respect to each of the plurality of input terminals while selectively putting the first output terminal into a connected state of being connected to any one of the plurality of input terminals or selectively puts the second output terminal into a connected state of being connected to any one of the plurality of input terminals while putting the first output terminal into an open state of being open with respect to each of the plurality of input terminals;
 a matching network that is connected to the first output terminal;
 an amplifier that is connected to an output side of the matching network;

a second switching circuit that is connected to an output side of the amplifier and enters a non-conductive state when the first switching circuit puts the first output terminal into the open state and selectively puts the second output terminal into the connected state of being connected to any one of the plurality of input terminals; and a bypass path that electrically connects the second output terminal and an output terminal of the second switching circuit to each other; wherein the amplifier is a variable-gain amplifier.

2. The amplification circuit according to claim 1, wherein at least two of the first switching circuit, the matching network, the amplifier, and the second switching circuit are mounted on one substrate.

3. The amplification circuit according to claim 2, wherein a component of the first switching circuit, the matching network, the amplifier, and the second switching circuit includes at least one passive component and at least one semiconductor element; and the at least one passive component and the at least one semiconductor element are mounted on the substrate.

4. The amplification circuit according to claim 3, wherein a component of the first switching circuit, the matching network, the amplifier, and the second switching circuit includes a plurality of semiconductor elements; and the plurality of semiconductor elements are mounted on the substrate by being stacked.

5. The amplification circuit according to claim 2, wherein at least one of the first switching circuit, the matching network, the amplifier, and the second switching circuit is mounted on a first surface of the substrate; and at least one of a rest of the first switching circuit, the matching network, the amplifier, and the second switching circuit is mounted on a second surface opposite to the first surface of the substrate.

6. The amplification circuit according to claim 5, wherein a component of the first switching circuit, the matching network, the amplifier, and the second switching circuit includes at least one passive component and at least one semiconductor element;

the at least one passive component is mounted on the first surface; and the at least one semiconductor element is mounted on the second surface.

7. The amplification circuit according to claim 2, wherein at least one of the first switching circuit, the matching network, the amplifier, and the second switching circuit is mounted on the substrate; and at least one of a rest of the first switching circuit, the matching network, the amplifier, and the second switching circuit is mounted in the substrate.

8. The amplification circuit according to claim 7, wherein a component of the first switching circuit, the matching network, the amplifier, and the second switching circuit includes at least one passive component and at least one semiconductor element;

the at least one passive component is mounted on the substrate; and the at least one semiconductor element is mounted in the substrate.

9. An amplification circuit comprising:
a first switching circuit that includes a plurality of input terminals that correspond to signals of a plurality of frequency bands, a first output terminal and a second output terminal, and that puts the second output terminal into an open state of being open with respect to each of the plurality of input terminals while selectively putting the first output terminal into a connected state of being connected to any one of the plurality of input terminals or selectively puts the second output terminal into a connected state of being connected to any one of the plurality of input terminals while putting the first output terminal into an open state of being open with respect to each of the plurality of input terminals;

a matching network that is connected to the first output terminal;

an amplifier that is connected to an output side of the matching network;

a second switching circuit that is connected to an output side of the amplifier and enters a non-conductive state when the first switching circuit puts the first output terminal into the open state and selectively puts the second output terminal into the connected state of being connected to any one of the plurality of input terminals; and a bypass path that electrically connects the second output terminal and an output terminal of the second switching circuit to each other; wherein the matching network is an impedance-variable matching network.

10. The amplification circuit according to claim 9, wherein the matching network includes at least one of:
a first circuit including a plurality of first inductors connected in series and a switch connected in parallel to at least one of the plurality of first inductors;

a second circuit including a plurality of first capacitors connected in series and a switch connected in parallel to at least one of the plurality of first capacitors;

a third circuit including a plurality of second inductors connected in parallel and a switch connected in series to at least one of the plurality of second inductors; and a fourth circuit including a plurality of second capacitors connected in parallel and a switch connected in series to at least one of the plurality of capacitors.

11. An amplification circuit comprising:
a first switching circuit that includes one or more input terminals, a first output terminal, a second output terminal, and a third output terminal, and that puts the second output terminal into an open state of being open with respect to each of the one or more input terminals while selectively putting one of the first output terminal and the third output terminal into a connected state of being connected to any one of the one or more input terminals or selectively puts the second output terminal into a connected state of being connected to any one of the one or more input terminals while putting the first output terminal and the third output terminal into an open state of being open with respect to each of the one or more input terminals;

a first matching network that is connected to the first output terminal;

a first amplifier that is connected to an output side of the first matching network;

a second switching circuit that is connected to an output side of the first amplifier and enters a non-conductive state when the first switching circuit puts the first output terminal and the third output terminal into the open state and selectively puts the second output terminal into the connected state of being connected to any one of the one or more input terminals;

a bypass path that electrically connects the second output terminal and an output terminal of the second switching circuit; and a second matching network connected to the third output terminal.

12. The amplification circuit according to claim 11, further comprising:

a second amplifier connected to an output side of the second matching network; and a fourth switching circuit connected between an output terminal of the second amplifier, and a connection point of the first matching network and an input terminal of the first amplifier; wherein the fourth switching circuit enters a non-conductive state when the first switching circuit puts the third output terminal in an open state.

13. The amplification circuit according to claim 11, wherein at least one of the first amplifier and the second amplifier is a variable-gain amplifier.

14. The amplification circuit according to claim 11, wherein an output terminal of the first matching network and an output terminal of the second matching network are connected to each other, and are connected to an input terminal of the first amplifier.

15. An amplification circuit comprising:

a first amplifying unit and a second amplifying unit that each include an amplification circuit according to claim 1; and a third switching circuit that includes an input terminal, a first group of plurality of output terminals, and a second group of plurality of output terminals and that performs at least one of selectively putting the input terminal into a state of being connected to at least one of the first group of plurality of output terminals and selectively putting the input terminal into a state of being connected to at least one of the second group of plurality of output terminals; wherein the first amplifying unit is connected to the first group of plurality of output terminals; and the second amplifying unit is connected to the second group of plurality of output terminals.

16. The amplification circuit according to claim 15, wherein the third switching circuit includes a multiplexer that includes at least four filters with different frequency bands; and at least one of the four filters is defined by a combination of an elastic wave filter and a passive component.

* * * * *